(12) United States Patent
Gupta et al.

(10) Patent No.: US 9,291,152 B2
(45) Date of Patent: Mar. 22, 2016

(54) METHOD FOR OPERATING A POWER GENERATION SYSTEM

(75) Inventors: Amit Kumar Gupta, Singapore (SG); John Godsk Nielsen, Hornslet (DK); Liang Yang, Singapore (SG)

(73) Assignee: Vestas Wind Systems A/S, Aarhus N. (DK)

( * ) Notice: Subject to any disclaimer, the term of this patent is extended or adjusted under 35 U.S.C. 154(b) by 0 days.

(21) Appl. No.: 13/884,190

(22) PCT Filed: Nov. 10, 2011

(86) PCT No.: PCT/DK2011/050425
§ 371 (c)(1), (2), (4) Date: Jun. 13, 2013

(87) PCT Pub. No.: WO2012/062327
PCT Pub. Date: May 18, 2012

(65) Prior Publication Data
US 2013/0264824 A1    Oct. 10, 2013

Related U.S. Application Data

(60) Provisional application No. 61/411,938, filed on Nov. 10, 2010.

(30) Foreign Application Priority Data

Nov. 10, 2010  (DK) .................................. 2010 70479

(51) Int. Cl.
*H02P 9/04* (2006.01)
*F03D 7/00* (2006.01)
(Continued)

(52) U.S. Cl.
CPC ................ *F03D 7/00* (2013.01); *F03D 7/0284* (2013.01); *F03D 7/042* (2013.01); *F03D 9/003* (2013.01);
(Continued)

(58) Field of Classification Search
CPC ............................ Y02E 10/723; Y02E 10/763
USPC ...................................................... 290/44, 55
See application file for complete search history.

(56) References Cited

U.S. PATENT DOCUMENTS 4,775,924 A * 10/1988 Sweezy ........................... 363/51
7,423,412 B2 * 9/2008 Weng et al. ..................... 322/20
(Continued)

FOREIGN PATENT DOCUMENTS

| GB | 2451463 A | 2/2009 |
|---|---|---|
| WO | 2008061698 A2 | 5/2008 |
| WO | 2010028689 A1 | 3/2010 |

OTHER PUBLICATIONS

Search Report in priority application PA201070479, issued by Danish Patent and Trademark Office, Jun. 16, 2011.

(Continued)

*Primary Examiner* — Tulsidas C Patel
*Assistant Examiner* — Sean Gugger
(74) *Attorney, Agent, or Firm* — Patterson & Sheridan, LLP

(57) ABSTRACT

A method for operating a power generation system coupled to a power grid during a grid unbalance event, a method for determining an injection current to be supplied into a power grid by a power generation system, and a method for addressing an asymmetric grid fault in a power grid connected to a power generation system are provided. The methods may be carried out based on a reactive or an active power/current priority.

46 Claims, 24 Drawing Sheets

(51) Int. Cl.
  *F03D 7/02* (2006.01)
  *F03D 7/04* (2006.01)
  *H02J 3/26* (2006.01)
  *H02J 3/38* (2006.01)
  *F03D 9/00* (2006.01)
  *H02J 3/00* (2006.01)

(52) U.S. Cl.
  CPC . *H02J 3/26* (2013.01); *H02J 3/386* (2013.01); *H02P 9/04* (2013.01); *F05B 2270/337* (2013.01); *H02J 2003/001* (2013.01); *Y02E 10/723* (2013.01); *Y02E 10/725* (2013.01); *Y02E 10/763* (2013.01); *Y02E 40/50* (2013.01)

(56) References Cited

U.S. PATENT DOCUMENTS

| | | | |
|---|---|---|---|
| 2007/0177314 A1* | 8/2007 | Weng et al. | 361/20 |
| 2009/0251096 A1* | 10/2009 | Schulz et al. | 318/801 |
| 2010/0052322 A1* | 3/2010 | Fortmann et al. | 290/44 |
| 2010/0109328 A1* | 5/2010 | Li et al. | 290/44 |
| 2010/0213925 A1* | 8/2010 | Teodorescu et al. | 324/76.78 |
| 2011/0215775 A1* | 9/2011 | Engelhardt et al. | 323/205 |
| 2013/0010505 A1* | 1/2013 | Bo et al. | 363/37 |
| 2013/0057297 A1* | 3/2013 | Cheng et al. | 324/548 |

OTHER PUBLICATIONS

Wang Y; Xu L; Williams B W: "Compensation of network voltage unbalance using doubly fed induction generator-based wind farms", IET Renewable Power Generation, vol. 3, No. 1, Journal Article, Mar. 9, 2009.

Pedro Rodriguez; Gustavo Medeiros; Alvaro Luna; Marcelo C Cavalcanti; Remus Teodorescu: "Safe current injection strategies for a STATCOM under asymmetrical grid faults", Energy Conversion Congress and Exposition (ECCE), 2010 IEEE, ISBN 978-1-4244-5286-6; ISBN 1-4244-5286-4, Conference Proceedings Article, Sep. 12, 2010.

Examination Report in priority application PA201070479, issued by Danish Patent and Trademark Office, Jun. 23, 2011.

Rodriguez, P., et al. "Safe current injection strategies for a STATCOM under asymmetrical grid faults," Energy Conversion Congress and Exposition (ECCE), 2010 IEEE, ISBN 978-1-4244-5286-6; ISBN 1-4244-5286-4, Conference Proceedings Article, Sep. 12, 2010.

Yi Wang, et al.: "Control of DFIG-based wind farms for network unbalance compensation", Power Electronics Specialists Conference, 2008. PESC 2008. IEEE, IEEE, Piscataway, NJ, USA, Jun. 15, 2008, pp. 113-119, XP031299962, ISBN: 978-1-4244-1667-7, p. 113-p. 117.

International Search Report and Written Opinion, DK2011/050425, May 31, 2013.

* cited by examiner

METHOD FOR OPERATING A POWER GENERATION SYSTEM

TECHNICAL FIELD

The present invention relates generally to a method for operating a power generation system coupled to a power grid during a grid fault event or a grid unbalance event. The present invention also relates generally to a method for determining an injection current to be supplied into a power grid by a power generation system. The present invention also relates generally to a method for addressing an asymmetric grid fault in a power grid connected to a power generation system.

BACKGROUND

In the recent years, demand for green energy has increased. Wind turbines, which convert wind energy into electrical energy, are a means for green energy. As such, reliance on wind energy has also increased over the recent years. Due to this increased penetration of wind energy, grid codes regulating connections with power grids have become stricter over the time.

Existing and upcoming grid codes state fault ride through requirements which require the wind turbines to stay connected with the grid for a certain period of time to support the grid during occurrences of grid faults. Most grid faults are asymmetrical in nature. Thus, it is desirable that the wind turbines can remain operating (keep supporting the grid) without tripping under an asymmetrical fault condition or a voltage unbalance condition.

SUMMARY

According to one embodiment, a method for operating a power generation system coupled to a power grid during a grid unbalance event or a grid fault event is provided, the method comprising determining a power grid voltage; determining a negative sequence grid voltage of the power grid from the power grid voltage; comparing the determined negative sequence grid voltage with a reference voltage; and determining a negative sequence reactive injection current for a possible injection into the power grid by the power generation system based on the result of the comparison.

According to one embodiment, the reference voltage specifies the negative sequence grid voltage towards which the determined negative sequence grid voltage should be reduced by supplying the negative sequence reactive injection current to the power grid.

According to one embodiment, the reference voltage is a tolerance limit on the amount of negative sequence grid voltage for which the power generation system can handle.

According to one embodiment, the reference voltage is set to a small percentage of the nominal grid voltage for which the power generation system can handle.

According to one embodiment, the negative sequence reactive injection current is supplied into the power grid when the determined negative sequence grid voltage exceeds the reference voltage.

According to one embodiment, the negative sequence reactive injection current has a linear relationship with the negative sequence grid voltage up to a predetermined maximum negative sequence injection current limit.

According to one embodiment, the maximum negative sequence reactive injection current limit is a current limit depending on a maximum current limit of a converter of the power generation system and a positive sequence reactive injection current value.

According to one embodiment, the linear relationship between the negative sequence reactive injection current and the negative sequence grid voltage is represented by a slope.

According to one embodiment, the slope is substantially inversely proportional to a total impedance of one or more of a group consisting of an impedance of a nacelle transformer, an impedance of a wind park transformer, and an impedance of the power grid.

According to one embodiment, the negative sequence reactive injection current and the negative sequence grid voltage have a non-linear relationship or a tabular relationship.

According to one embodiment, the method further comprises determining a positive sequence reactive injection current for a possible injection into the power grid based on at least one of a positive sequence grid voltage, a minimum line voltage, a maximum line voltage, a minimum phase voltage and a maximum phase voltage.

According to one embodiment, the positive sequence reactive injection current is determined based on the positive sequence grid voltage and the method further comprises determining the positive sequence grid voltage of the power grid from the power grid voltage.

According to one embodiment, the determining of the positive sequence reactive injection current for a possible injection into the power grid is based on the positive sequence grid voltage, the minimum line voltage, the maximum line voltage, the minimum phase voltage or the maximum phase voltage depending on at least one of the country in which the power generation system is operated, the region in which the power generation system is operated and a grid code applicable for the power generation system.

According to one embodiment, a method for determining an injection current to be supplied into a power grid by a power generation system is provided, the method comprising determining whether a sum of a negative sequence component and a positive sequence component of a first component of the injection current is above a predetermined current limit; if it is determined that the sum is above the predetermined current limit,
  setting a second component of the injection current to a predetermined value; and
  setting the negative sequence component of the first component of the injection current such that the sum of the positive sequence component and the negative sequence component of the first component of the injection current does not exceed the predetermined current limit.

According to one embodiment, the first component of the injection current is a reactive injection current.

According to one embodiment, the second component of the injection current is an active injection current.

According to one embodiment, the predetermined value is zero.

According to one embodiment, the power generation system comprises a converter having a DC link, and wherein the method further comprises determining whether an active power ripple value caused by the injection current in accordance with the positive sequence component and the negative sequence component of the first component of the injection current exceeds a predetermined maximum allowed active power ripple value.

According to one embodiment, the maximum allowed active power ripple value depends on at least one of the power output from a generator of the power generation system, the resistance value of a chopper resistor of the converter, the DC-link voltage, an allowed DC-link ripple voltage, the power grid voltage, the first component of the injection current and the second component of the injection current.

According to one embodiment, the method further comprises, if it has been determined that the active power ripple value exceeds the predetermined maximum allowed active power ripple value, adjusting the positive sequence component and the negative sequence component of the first component of the injection current such that the active power ripple value does not exceed the predetermined maximum allowed active power ripple value.

According to one embodiment, the positive sequence component and the negative sequence component of the first component of the injection current are adjusted such that the injection current in accordance with the adjusted positive sequence component and the adjusted negative sequence component of the first component of the injection current does not exceed the predetermined current limit.

According to one embodiment, the positive sequence component and the negative sequence component of the first component of the injection current are adjusted depending on whether the active power ripple value is negative or positive.

According to one embodiment, the method further comprises determining whether a grid side converter voltage according to the injection current in accordance with the adjusted positive sequence component and the adjusted negative sequence component of the first component of the injection current exceeds a predetermined converter voltage limit.

According to one embodiment, the method further comprises, if it has been determined that the grid side converter voltage exceeds the predetermined converter voltage limit, further adjusting the adjusted positive sequence component and the adjusted negative sequence component of the first component of the injection current such that the grid side converter voltage does not exceed the predetermined converter voltage limit.

According to one embodiment, the positive sequence component and the negative sequence component of the first component of the injection current are further adjusted such that the injection current in accordance with the further adjusted positive sequence component and the further adjusted negative sequence component of the first component of the injection current does not exceed the predetermined current limit.

According to one embodiment, the method further comprises, if it has been determined that the active power ripple is below the predetermined maximum allowed active power ripple, determining whether a grid side converter voltage according to the injection current in accordance with the positive sequence component and the negative sequence component of the first component of the injection current exceeds a predetermined converter voltage limit.

According to one embodiment, the method further comprises, if it has been determined that the grid side converter voltage exceeds the predetermined converter voltage limit, adjusting the positive sequence component and the negative sequence component of the first component of the injection current such that the grid side converter voltage does not exceed the predetermined converter voltage limit.

According to one embodiment, the positive sequence component and the negative sequence component of the first component of the injection current are adjusted such that the injection current in accordance with the adjusted positive sequence component and the adjusted negative sequence component of the first component of the injection current does not exceed the predetermined current limit.

According to one embodiment, a method for addressing an asymmetric grid fault or a grid unbalance event in a power grid connected to a power generation system is provided, the method comprising determining a first component of an injection current; determining an active power ripple caused by the injection current comprising the first component; determining if the active power ripple caused by the injection current comprising the first component exceeds a reference power of the power generation system; if it is determined that the active power ripple caused by the injection current comprising the first component is below the reference power of the power generation system, determining, based on the first component of the injection current, a negative sequence component and a positive sequence component of a second component of the injection current such that phase currents of the injection current comprising the first component and the second component do not exceed a predetermined phase current limit and an active power ripple caused by the injection current comprising the first component and the second component does not exceed a predetermined maximum allowed active power ripple.

According to one embodiment, the first component of the injection current is a reactive injection current.

According to one embodiment, the second component of the injection current is an active injection current.

According to one embodiment, the reference power of the power generation system is a power generated by a generator of the power generation system.

According to one embodiment, the method further comprises, if it is determined that the active power ripple caused by the injection current comprising the first component exceeds the reference power of the power generation system, setting the negative sequence component and the positive sequence component of the second component of the injection current to a predetermined value.

According to one embodiment, the predetermined value is zero.

According to one embodiment, the method further comprises adjusting a negative sequence component of the first component of the injection current depending on whether the active power ripple value is negative or positive.

According to one embodiment, the method further comprises determining whether it is required to derate the second component of the injection current and derating the second component of the injection current if it has been determined that it is required to derate the second component of the injection current.

According to one embodiment, the method further comprises determining whether a grid side converter voltage according to the injection current comprising the first component and the second component exceeds a predetermined converter voltage limit.

According to one embodiment, the method further comprises, if it has been determined that the grid side converter voltage exceeds the predetermined converter voltage limit, adjusting the positive sequence component and the negative sequence component of the second component of the injection current such that the grid side converter voltage does not exceed the predetermined converter voltage limit.

According to one embodiment, the first component of the injection current is an active injection current.

According to one embodiment, the second component of the injection current is a reactive injection current.

According to one embodiment, determining the first component of the injection current comprises determining a positive sequence component and a negative sequence component of the first component of the injection current such that the active power ripple caused by the injection current comprising the first component and the second component does not exceed the maximum allowed active power ripple and such that the power transfer to the power grid from the power generation system turbine is maximum.

According to one embodiment, the method further comprises selecting, from a plurality of possible solutions for the positive and negative sequence components of the first component values for the positive and negative sequence components of the first component depending on at least one of information about the situation in the power grid and the performance of the power generation system.

According to one embodiment, the method further comprises determining whether a grid side converter voltage according to the injection current comprising the first component and the second component exceeds a predetermined converter voltage limit.

According to one embodiment, the method further comprises, if it has been determined that the grid side converter voltage exceeds the predetermined converter voltage limit, adjusting the positive sequence component and the negative sequence component of the second component of the injection current such that the grid side converter voltage does not exceed the predetermined converter voltage limit.

According to one embodiment, the reference power of the power generation system is a predetermined maximum allowed active power ripple.

According to one embodiment, the determined first component and the determined second component of the injection current are provided to a grid side converter current control.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
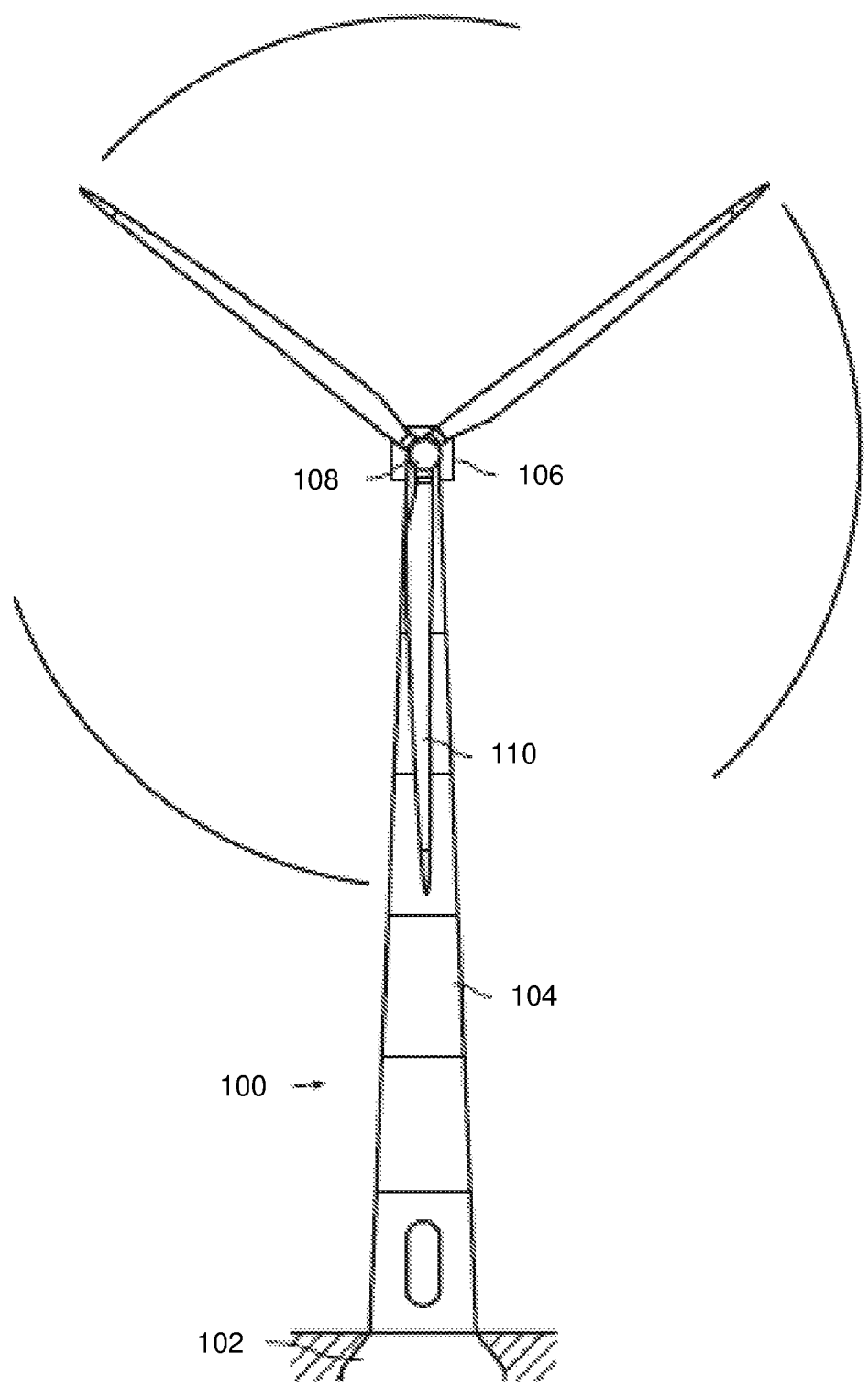
FIG. 1 illustrates a common setup of a conventional wind turbine.

FIG. 1 illustrates a common setup of a conventional wind turbine 100. The wind turbine 100 is mounted on a base 102. The wind turbine 100 includes a tower 104 having a number of tower sections. A wind turbine nacelle 106 is placed on top of the tower 104. The wind turbine rotor includes a hub 108 and at least one rotor blade 110, e.g. three rotor blades 110. The rotor blades 110 are connected to the hub 108 which in turn is connected to the nacelle 106 through a low speed shaft which extends out of the front of the nacelle 106. The low speed shaft typically drives a generator (not shown) for producing electrical power. The electrical power generated is thereafter usually conditioned by a converter system (not shown), comprising a power converter, prior to delivery from the wind turbine to a grid.

Grid-connected power converters should be designed and controlled bearing in mind that they should provide a proper operation under generic grid voltage conditions. The electrical network is a dynamical system, whose behavior depends upon many factors, as for instance constraints set by power generation systems, the occurrence of grid faults and other contingences, the excitation of resonances or the existence of non-linear loads. With the increased penetration of wind power, grid codes for the wind power are getting stricter. According to various grid codes, grid fault handling is one of the most important requirements from the wind power plant. Generally, about 90%-95% of the grid faults are asymmetrical grid faults which are normally phase-ground, phase-phase or phase-phase-ground faults. During occurrences of grid faults, modern power converters (essentially wind turbines) should provide a reliable response.

For the asymmetrical fault or unbalance handling, four current references, positive sequence reactive current reference ($I_r^+$), negative sequence reactive current reference ($I_r^-$), positive sequence active current reference ($I_a^+$) and negative sequence active current reference ($I_a^-$) are provided to the grid side converter control. During normal voltage condition and symmetrical fault condition, the negative sequence reactive current reference ($I_r^-$) and the negative sequence active current reference ($I_a^-$) are zero. However, during asymmetrical grid faults and voltage unbalance condition, the negative sequence reactive current reference ($I_r^-$) and the negative sequence active current reference ($I_a^-$) are may be nonzero (for better support). The negative sequence reactive current reference ($I_r^-$) and the negative sequence active current reference ($I_a^-$) will be calculated and fed to grid current control algorithm for better handling.

Figure 2:
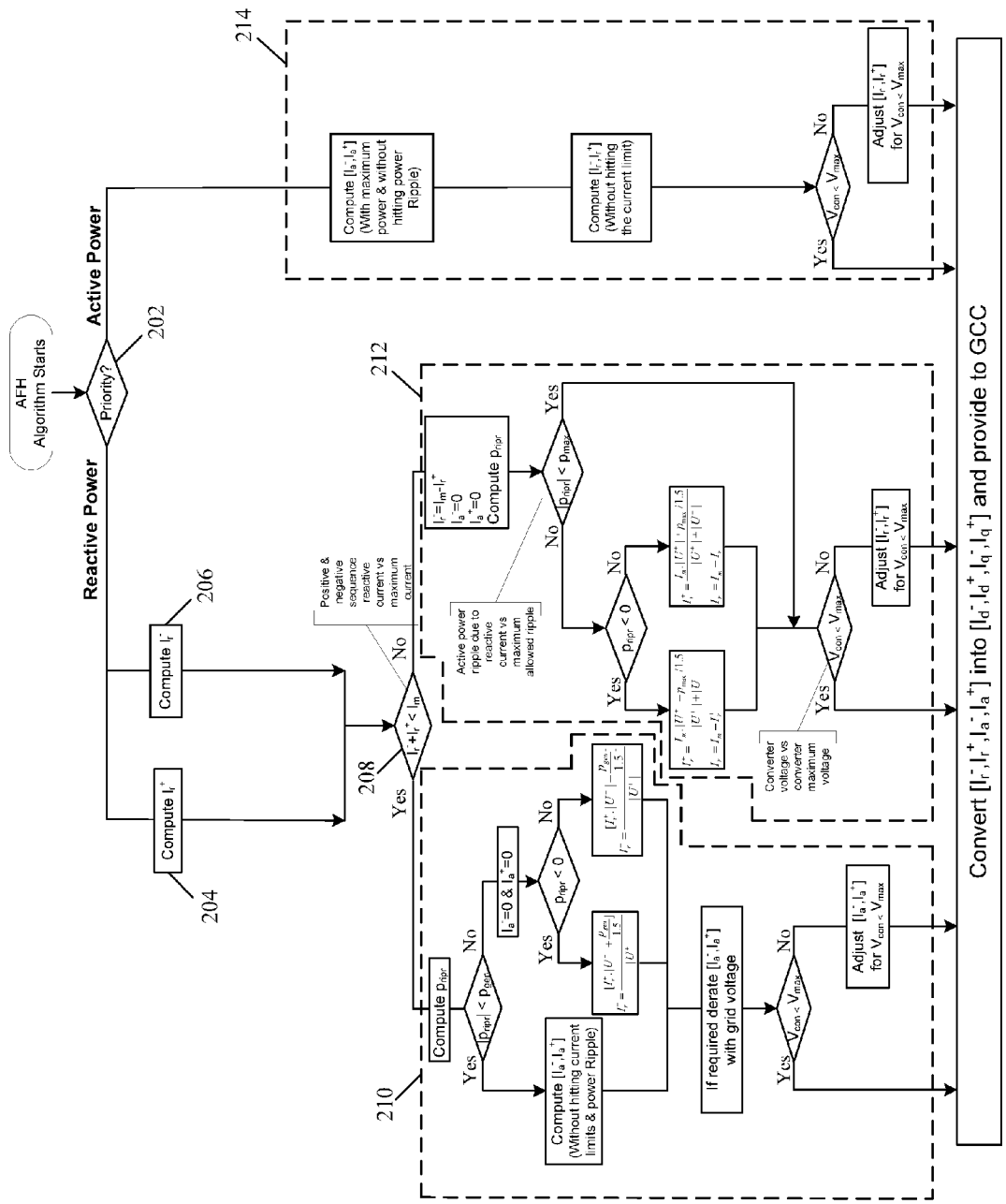
FIG. 2 shows a flowchart for determining a current injected into a grid during an asymmetrical fault.

FIG. 2 shows a flowchart 200 for determining a current injected into a power grid by a power generation system (e.g. wind turbine) during an asymmetrical fault. In one embodiment, the power generation system may operate as a static synchronous compensator (STATCOM). At 202, it is determined (based on wind turbine operation strategy or grid code requirements) if the current injected into the power grid (hereinafter referred as "injection current") should be determined based on reactive power/current priority or active power/current priority. If it is determined that the injection current should be determined based on reactive power/current priority, a positive sequence reactive current $I_r^+$ is determined at 204 and a negative sequence reactive current $I_r^-$ is determined at 206. It is then determined at 208 if a sum of the positive sequence reactive current $I_r^+$ and the negative sequence reactive current $I_r^-$ is smaller than a maximum current limit.

If the sum of the positive sequence reactive current $I_r^+$ and the negative sequence reactive current $I_r^-$ is smaller than a maximum current limit, the flowchart 200 proceeds to determine the injection current using a sequence 210.

If the sum of the positive sequence reactive current $I_r^+$ and the negative sequence reactive current $I_r^-$ is greater than a maximum current limit, the flowchart 200 proceeds to determine the injection current using a sequence 212.

If it is determined that the injection current should be determined based on active power priority, the flowchart 200 proceeds to determine the injection current using a sequence 214.

It should be noted that depending on the wind turbine operation strategy and performance factors, any of the three sequence described above may be chosen. Even if the sum of the positive sequence reactive current $I_r^+$ and the negative sequence reactive current $I_r^-$ is smaller than a maximum current limit, the sequence 212 may be used to determine the injection current.

Details of various processes of the flowchart 200 are described in the following.

Reactive Power/Current Priority

An example of calculating the positive sequence reactive current ($I_r^+$) and the negative sequence reactive current ($I_r^-$) for reactive power or current priority will be described in the following. According to one embodiment, at any given point of time, it is ensured that the following objectives are met while keeping in mind the grid codes and optimal operation of the power converter:

1. Converter phase currents do not exceed their allowed limit. On the other hand, for the best use of the converter, the maximum current capability is used. To increase positive sequence voltage and to reduce negative sequence voltage, the currents should be injected accordingly.
2. DC-link ripple is within the specified limit i.e. the active power pulsation in the active power being fed to the grid is within the acceptable limit.
3. The power converter operates in a linear mode of modulation. This assumes that converter operation in over modulation region is not desired. However, if requested this can also be achieved.

Determining Positive Sequence Reactive Current $I_r^+$

Figure 3:
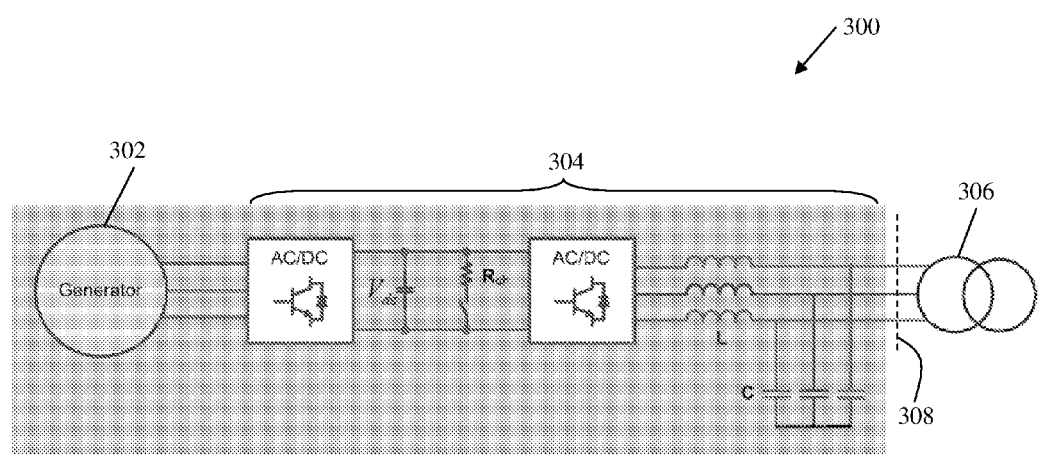
FIG. 3 shows a schematic diagram of a full scale converter based wind turbine.
Figure 4:
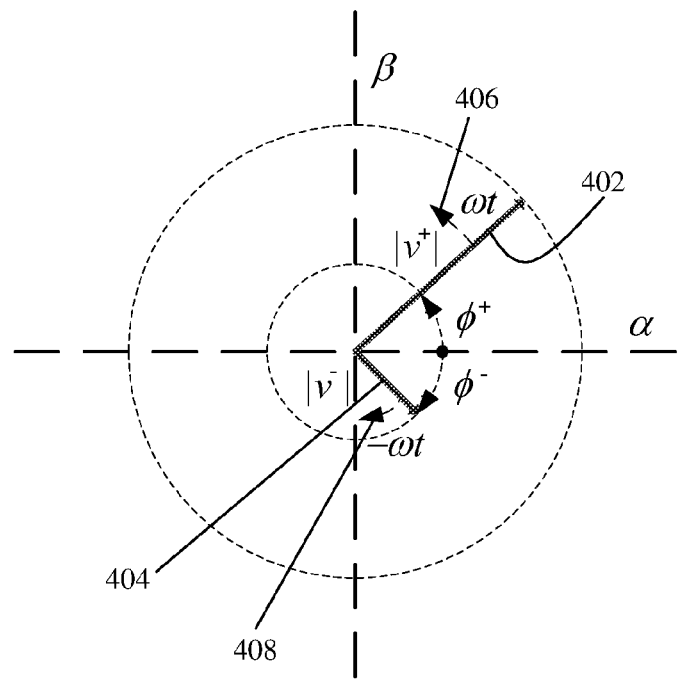
FIG. 4 shows a positive sequence component and a negative sequence component of the voltage at a low voltage side of a transformer used in a wind turbine.
Figure 5:
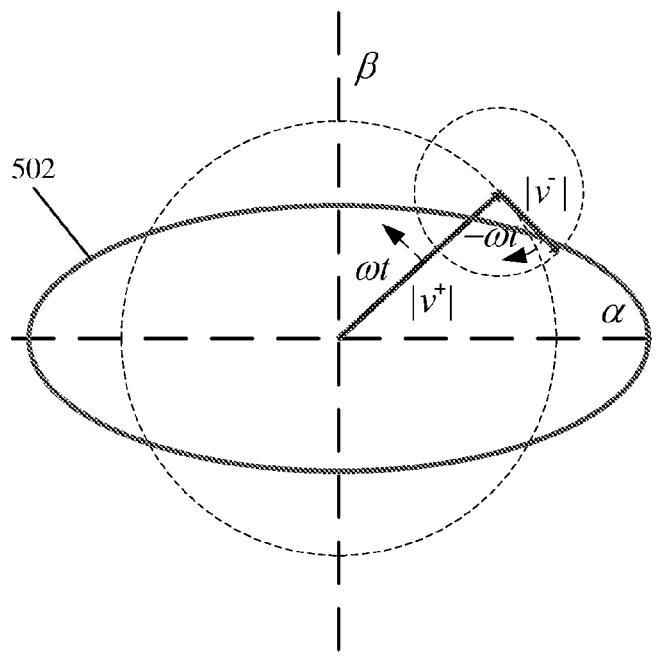
FIG. 5 shows a combined trajectory of a positive sequence component and a negative sequence component of the voltage at a low voltage side of a transformer used in a wind turbine for a given scenario.
Figure 6:
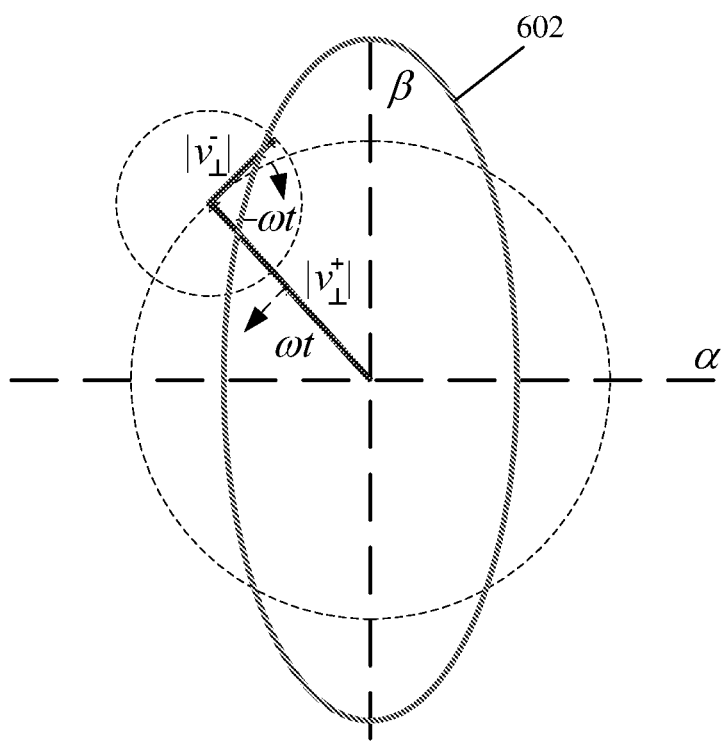
FIG. 6 shows a trajectory of a quadrature positive sequence voltage component/vector and a quadrature negative sequence voltage component/vector for a given scenario.

FIG. 3 shows a schematic diagram of a full scale converter based wind turbine 300. The wind turbine 300 has a generator 302, a full scale power converter (inclusive of grid filter) 304 and a transformer (e.g. nacelle transformer) 306. A voltage at a low voltage (LV) side 308 of the transformer 306 is used for wind turbine/converter control strategy. During normal condition, the voltage trajectory of the voltage at the LV side 308 of the transformer 306 is circular. This is due to the fact that the positive sequence component is close to the fundamental/rated (1 p.u.) and the negative sequence component is close to zero. However, during asymmetrical fault condition, the voltage seen at the LV side 308 of the transformer 306 has a non-zero positive sequence component and a non-zero negative sequence component. An example of a positive sequence component 402 and a negative sequence component 404 of the voltage at the LV side 308 of the transformer 306 are shown in FIG. 4. The positive sequence component 402 and the negative sequence component 404 rotate in opposite directions as indicated by arrow 406 and arrow 408 respectively. Due to their rotation in opposite directions, the combined trajectory of the positive sequence component 402 and the negative sequence component 404 is in this example an ellipse 502 as shown in FIG. 5. A major axis of the ellipse 502 makes 0° with the α-axis. FIG. 6 shows an example of a trajectory 602 of a quadrature positive sequence voltage component/vector and a quadrature negative sequence voltage component/vector. The trajectory 602 may for example be used for the determination of reactive current injection.

Depending on the type and nature of the grid faults, the length of the major and minor axis of the ellipse 502 changes as well as the angle which the major axis of the ellipse 502 makes with the α-axis. The major axis of the ellipse 502 can make any angle with the α-axis. A scenario with high ellipse eccentricity may create problems for the turbine control system such as power ripple, DC-link ripple and current overshoots leading to turbine trip and component damage in long term. Therefore, to comply with the requirements of the grid codes and to provide a proper turbine operation, it is desirable to reduce the negative sequence voltage and increase the positive sequence voltage in the grid. With the reduction in the magnitude of the negative sequence voltage and increase in the magnitude of the positive sequence voltage, the ellipse 502 in FIG. 5 tends towards a circular trajectory.

Figure 7:
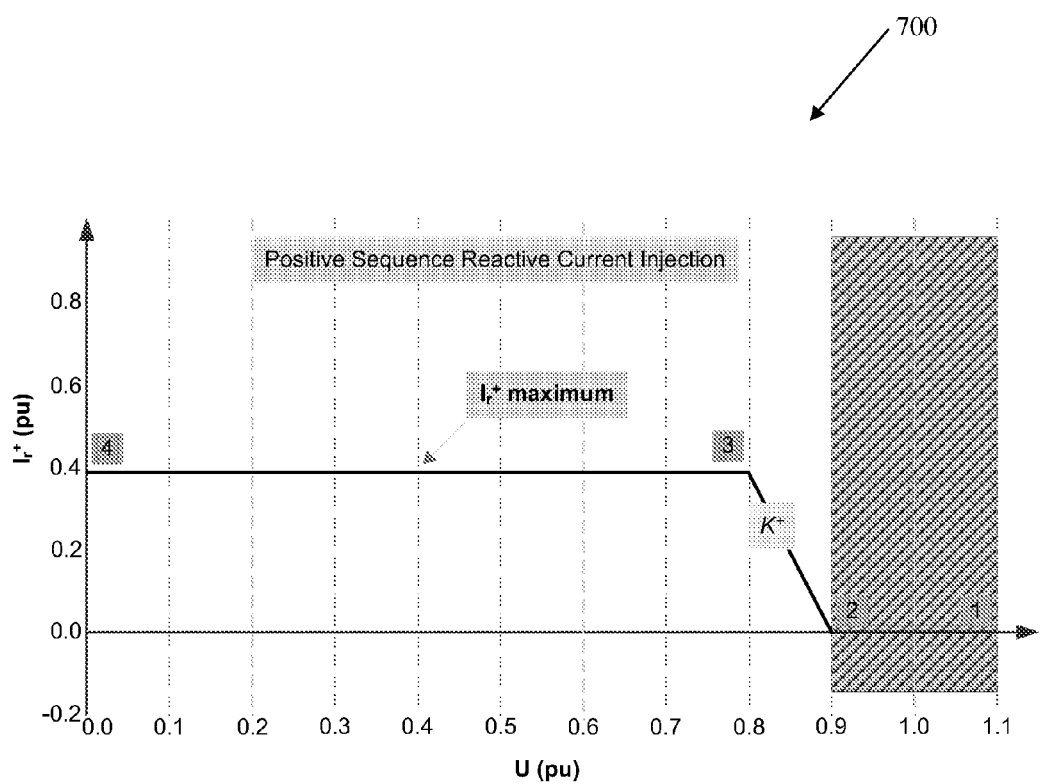
FIG. 7 shows an exemplary positive sequence reactive current injection profile for asymmetrical fault condition.

Positive sequence reactive current can be injected into the grid to increase the magnitude of positive sequence voltage, and negative sequence reactive current can be injected into the grid to reduce the magnitude of negative sequence voltage. The grid codes provide clear positive sequence reactive current injection profile especially for the symmetrical fault. FIG. 7 shows an exemplary positive sequence reactive current injection profile 700. The positive sequence reactive current injection profile 700 is drawn per the indications from some of the grid codes that roughly 0.4 p.u. reactive current injection is demanded but this can be higher or lower depending on the country/site and the system requirements. FIG. 7 shows a positive sequence reactive current $I_r^+$ (per unit (p.u.)) plotted against a voltage U (p.u.). "$I_r^+$ maximum" of the profile 700 represents the maximum positive sequence reactive current which a turbine operator can specify or the grid code operator can set (i.e. a default setting which is software programmable). The value of "$I_r^+$ maximum" is dependent on the country and region. Recently, some grid codes specified the value of "$I_r^+$ maximum" close to 0.4 p.u. and higher/lower. However, the value of "$I_r^+$ maximum" can be changed through the software interface as a programmable parameter. "$K^+$" of the profile 700 represents the gain for the current injection. The value of "$K^+$" is normally specified by the grid/turbine operator and is usually less than 10.

The voltage U on the x-axis of FIG. 7 can be (a) positive sequence voltage, (b) minimum line voltage, (c) maximum line voltage, (d) minimum phase voltage or (e) maximum phase voltage. For a symmetrical grid fault, any one of the above five voltages can be used as the voltage U on the x-axis. For an asymmetrical grid fault, one of positive sequence voltage, minimum line voltage and minimum phase voltage may be used for the x-axis. The voltage used for the x-axis is dependent on the country/region/grid code. Some grid codes may use any one of positive sequence voltage, minimum line voltage and maximum line voltage for symmetrical grid fault, and may use any one of positive sequence voltage and minimum line voltage for asymmetrical grid fault. Therefore, by providing all the above options for the voltage U on the x-axis, the wind turbine can be configured for any country/region/grid code.

In one embodiment, the positive sequence reactive injection current $I_r^+$ for a possible injection into the power grid may be determined based on at least one of a positive sequence grid voltage, a minimum line voltage, a maximum line voltage, a minimum phase voltage and a maximum phase voltage. The determining of the positive sequence reactive injection current $I_r^+$ for a possible injection into the power grid is based on the positive sequence grid voltage, the minimum line voltage, the maximum line voltage, the minimum phase voltage or the maximum phase voltage depending on at least one of the country in which the power generation system is operated, the region in which the power generation system is operated and a grid code applicable for the power generation system. In one embodiment, the positive sequence reactive injection current $I_r^+$ may be determined based on the positive sequence grid voltage. The positive sequence grid voltage may be determined from the power grid voltage.

Determining Negative Sequence Reactive Current $I_r^-$

Grid codes typically provide clear requirements for determination of positive sequence reactive injection current at least for the symmetrical grid faults. According to one embodiment, a method for calculating a negative sequence reactive injection current is provided.

The following describes a determination of the negative sequence reactive current to be injected into the grid under any asymmetrical grid fault conditions or any grid voltage unbalance conditions according to one embodiment.

Figure 8:
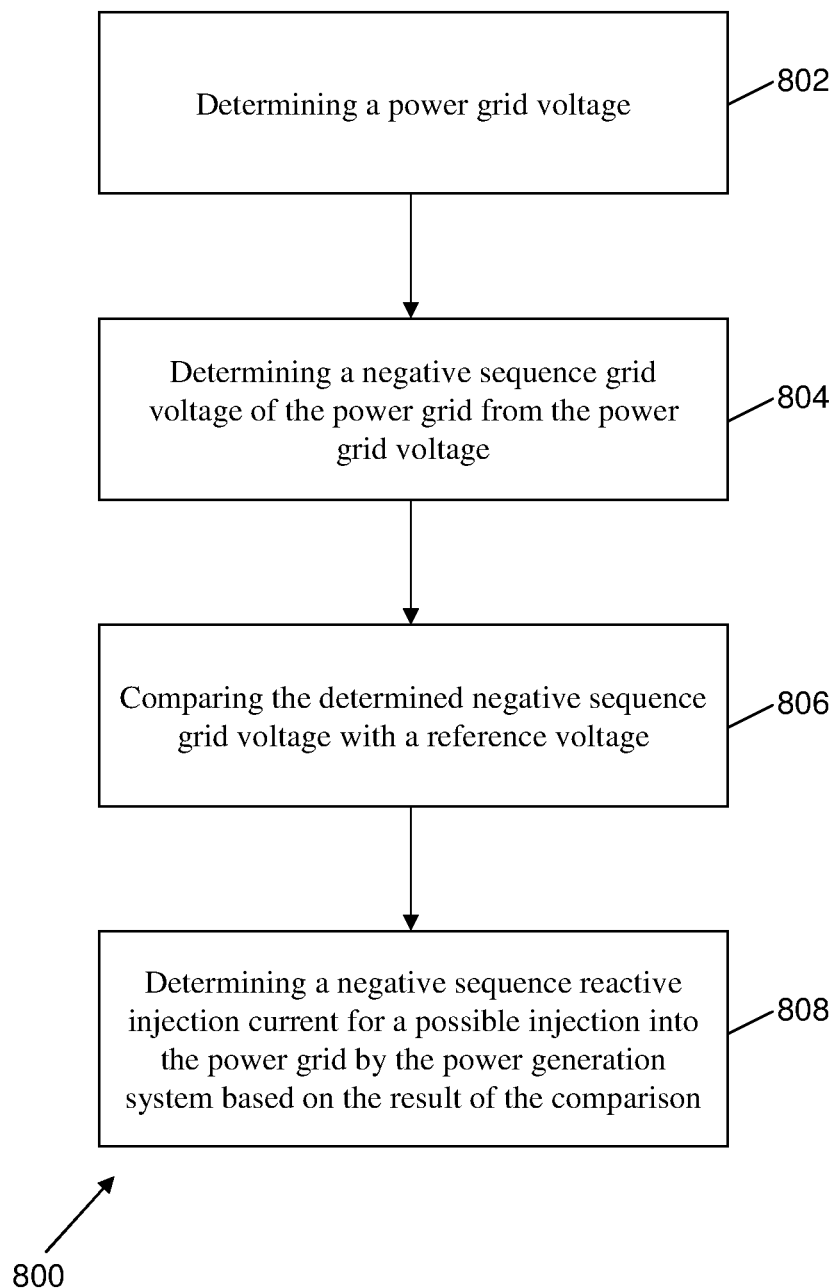
FIG. 8 shows a flowchart of a method for operating a power generation system coupled to a power grid during a grid unbalance event according to an embodiment.

FIG. 8 shows a flowchart 800 of a method for operating a power generation system coupled to a power grid during a grid unbalance event or a grid fault event. At 802, a power grid voltage is determined. At 804, a negative sequence grid voltage of the power grid is determined from the power grid voltage. At 806, the determined negative sequence grid voltage is compared with a reference voltage. In one embodiment, the reference voltage may be determined after 802 or 804 of the flowchart 800. At 808, a negative sequence reactive injection current for a possible injection by the power generation system into the power grid is determined based on the result of the comparison.

In one embodiment, the reference voltage may specify the negative sequence grid voltage to which the determined negative sequence grid voltage should be reduced by supplying the negative sequence reactive injection current to the power grid. The reference voltage may be a tolerance limit on the amount of negative sequence grid voltage for which the power generation system can handle. The reference voltage may be set to a small percentage (e.g. at least 2%) of the nominal grid voltage for which the power generation system can handle. The negative sequence reactive injection current $I_r^-$ may be supplied into the power grid when the determined negative sequence grid voltage exceeds the reference voltage. The negative sequence reactive injection current may have a linear relationship with the negative sequence grid voltage up to a predetermined maximum negative sequence reactive injection current limit. The maximum negative sequence reactive injection current limit may be a current limit depending on a maximum current limit of a converter of the power generation system and a positive sequence reactive injection current value. The linear relationship between the negative sequence reactive injection current and the negative sequence grid voltage may be represented by a slope. The slope may be substantially inversely proportional to a total impedance of one or more of an impedance of a nacelle transformer, an impedance of a wind park transformer, and an impedance of the power grid. In one embodiment, the negative sequence reactive injection current and the negative sequence grid voltage may have a non-linear relationship or a tabular relationship.

Negative sequence reactive current injection from the wind turbine can be done in such a manner that when there is a significant negative sequence grid voltage $v_g^-$, the negative sequence voltage seen by the WTG and the power plant/system can be reduced. To achieve this, the negative sequence voltage in the grid $v_g^-$ is first determined. For example, if the objective is to reduce the negative sequence voltage at the LV terminals of the WTG to be equal to a reference voltage $v_7^-$, the required negative sequence reactive current is given by following equation:

$$\vec{i_r} = \frac{(\vec{v_g^-} - \vec{v_7^-})}{(x_{tr} + x_{gr} + x_{pk})} \quad (1)$$

where $x_{tr}$ is the impedance of the nacelle transformer, $x_{pk}$ is the impedance of the wind park, and $x_{gr}$ is the grid impedance.

The description given above considers a point in the power system, i.e. a point in the grid, the PCC point or a point on the wind farm. In other words, equation (1) may be implemented with respect to a voltage at any other point in the grid, e.g. voltage at the point of common coupling (PCC) $v_{pcc}^-$.

Accordingly, the denominator of equation (1) will change. For example, smaller impedances will be used when the PCC point is used.

Figure 9:
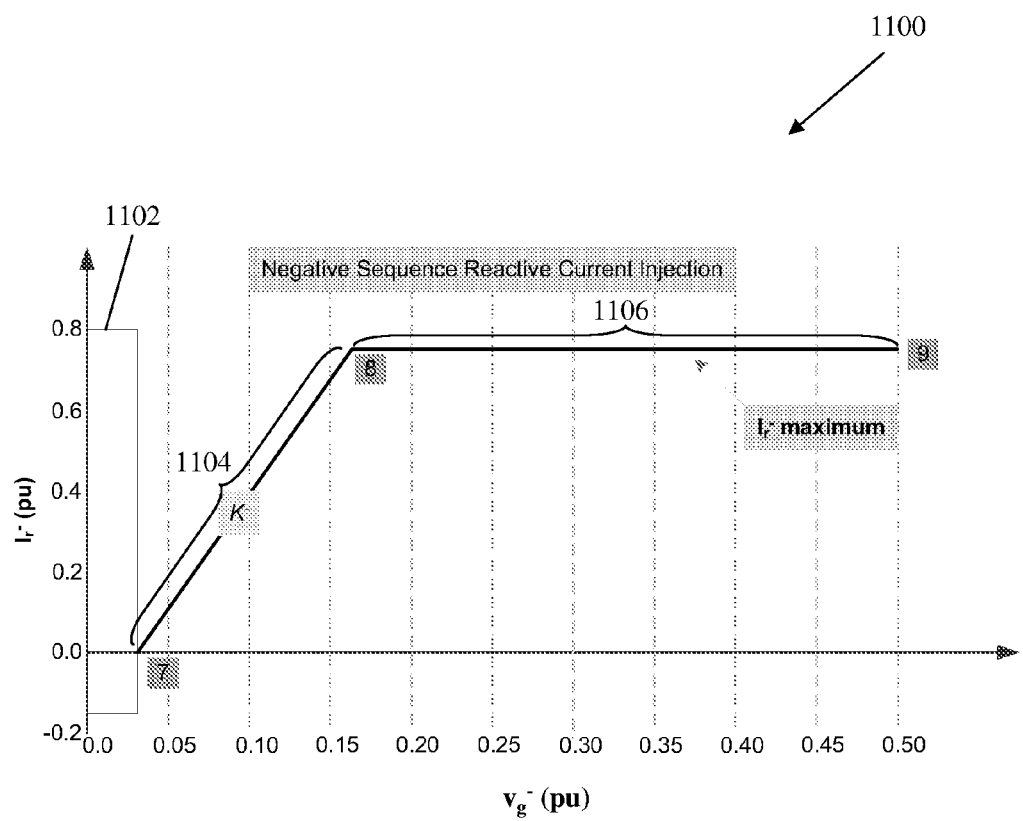
FIG. 9 shows an exemplary negative sequence reactive current injection profile according to an embodiment.

Figuratively, equation (1) can be represented by FIG. 9. FIG. 9 shows a negative sequence reactive current injection profile 1100. FIG. 9 shows a negative sequence reactive current $I_r^-$ plotted against negative sequence grid voltage $v_g^-$.

From FIG. 9, it can be observed that no reactive current injection is required when the voltage is below $v_7^-$ which can be small percentage (e.g. about 2-5%) of the nominal grid voltage. In other words, for the negative sequence grid voltage of 2-5% (as represented by shaded area 1102), no negative sequence reactive current injection is required. When the negative sequence grid voltage is more than $v_7^-$, negative sequence reactive current injection starts. A positive slope 1104 of the negative sequence reactive current injection profile 1100 signifies that as the negative sequence grid voltage increases, the negative sequence reactive current injection also increases. The slope 1104 is substantially inversely proportional to the total grid impedance. The grid is assumed to be substantially inductive here. The slope 1104 represents $K^-$ which is the gain for the negative sequence reactive current injection. Therefore, $K^-$ is substantially inversely proportional to total grid impedance.

In another embodiment, the value of $K^-$ can be set externally e.g. based on system or grid requirement related to grid compliance.

A horizontal line 1106 of the profile 1100 represents the maximum negative sequence reactive current injection value $I_r^-$. For reactive current or power priority, there is a finite limit on the amount of current which can be injected. This depends on two main factors, namely the converter maximum current limit $I_m$ and the positive sequence reactive current injection value $I_r^+$. The maximum value of negative sequence current injection is given by is given by $(I_m - I_r^+)$ assuming $I_r^+$ has higher priority. These may be used as it is or modified depending on the constraints.

Figure 10:
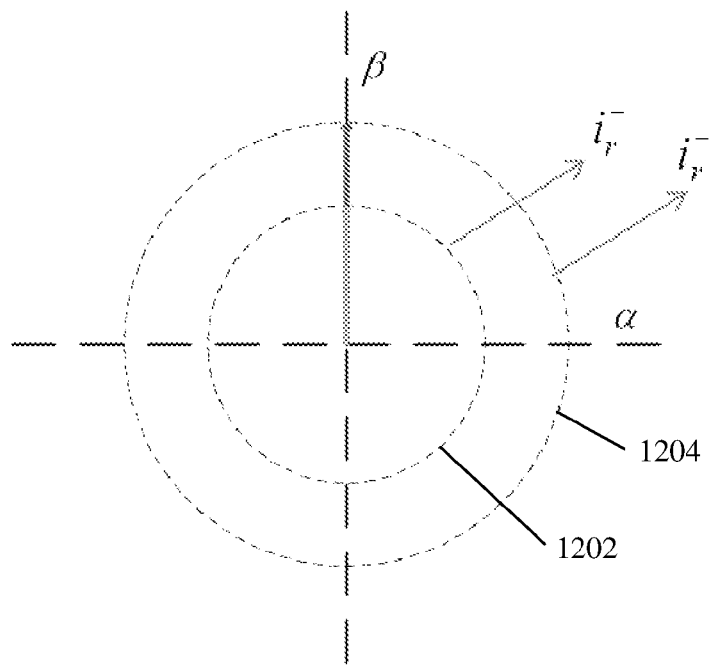
FIG. 10 shows a trajectory of positive sequence reactive current and a trajectory of negative sequence reactive current.
Figure 11:
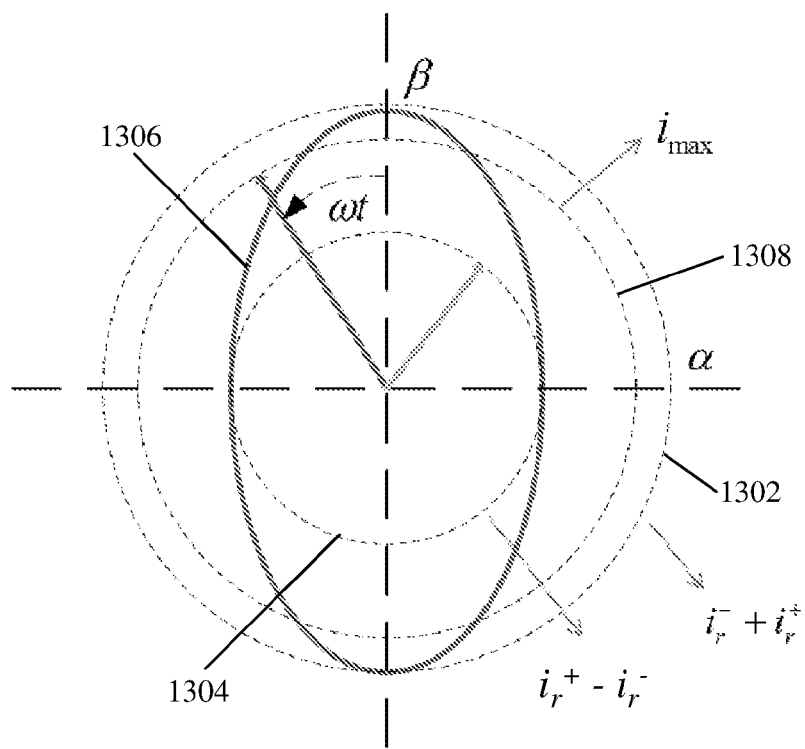
FIG. 11 shows a trajectory of current $(I_r^+ + I_r^-)$ and a trajectory of current $(I_r^+ - I_r^-)$.

The above described method provides a simple and reliable method for determining/predicting the amount of negative sequence reactive current to be injected into the grid. The method is scalar based. Implementation of the method requires equations (1). The method can be applied to all kinds of wind turbines e.g. full scale and doubly fed induction generator (DFIG) turbines with insignificant implementation cost. According to one embodiment, for a given value of $I_r^+$ and $I_r^-$, it is checked first if the power converter current limits are hit or not. Due to physical limit on the power converter, the power converter currents should not exceed a maximum current limit $I_m$ at any point of time. This can be explained through FIGS. 10 and 11. FIG. 10 shows a trajectory 1202 of $I_r^+$ and a trajectory 1204 of $I_r^-$. FIG. 11 shows a trajectory 1302 of a magnitude of current $(I_r^+ + I_r^-)$, a trajectory 1304 of a magnitude of current $(I_r^+ - I_r^-)$, and a trajectory 1306 of an instantaneous sum of $(I_r^+ + I_r^-)$. It can be seen from FIG. 13 that the trajectory 1306 of the instantaneous actual current trajectory. The sum of $(I_r^+ + I_r^-)$ may or may not exceed the maximum limit circle $I_m$ 1308. If the trajectory 1306 is more than the maximum limit circle $I_m$ 1308, it may signify extreme grid faults i.e. fault very close to wind farm and sever fault.

Figure 12:
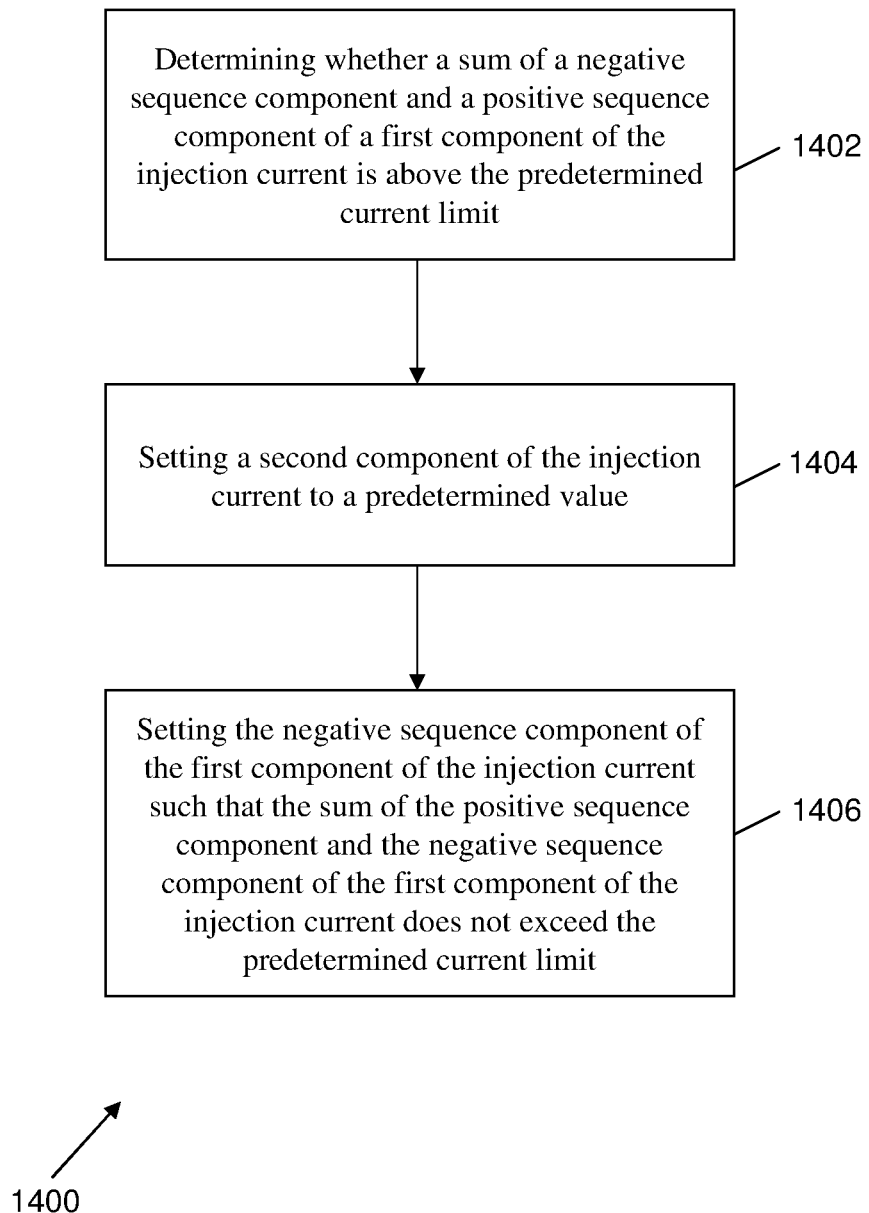
FIG. 12 shows a flowchart of a method for determining an injection current of a power generation system according to an embodiment.

If the Sum of the Positive Sequence Reactive Current $I_r^+$ and the Negative Sequence Reactive Current $I_r^-$ is Greater than a Maximum Current Limit $(I_r^+ + I_r^- > I_m)$ As mentioned above with reference to FIG. 2, sequence 212 is used to determine the injection current when it is determined that the sum of the positive sequence reactive current $I_r^+$ and the negative sequence reactive current $I_r^-$ is greater than a maximum current limit. FIG. 12 shows a flowchart 1400 of a process performed in sequence 212 of FIG. 2 for determining the injection current of a power generation system. At 1402, it is determined whether a sum of a negative sequence component and a positive sequence component of a first component of the injection current is above a predetermined current limit. In one embodiment, the negative sequence component and the positive sequence component may be the negative sequence component and the positive sequence component in a symmetrical component representation of the first component of the injection current. If it is determined that the sum is above the predetermined current limit, a second component of the injection current is set to a predetermined value at 1404. At 1406, the negative sequence component is set such that the sum of the positive sequence component and the negative sequence component of the first component of the injection current does not exceed the predetermined current limit.

In one embodiment, the first component is a reactive injection current. The second component is an active injection current. The predetermined value is zero. The predetermined current limit may be the maximum converter current $I_m$.

In more detail, for a given value of $I_r^+$ and $I_r^-$, when it is determined that $I_r^+ + I_r^- > I_m$, it may signify that the reactive current requirement are significantly high, the grid is supported with the best possible positive and negative sequence reactive currents and do not allow any active current injection i.e. $I_a^+ = I_a^- = 0$. However, if requested, the active current/power injection is possible.

According to one embodiment, to ensure that the sum of the positive and negative sequence reactive currents at any time is less than the current limit and to allow no active current injection, the values of $I_r^-$, $I_a^+$, and $I_a^-$ are set according to the following equation (2):

$$\left. \begin{array}{l} i_r^- = i_{max} - i_r^+ \\ i_a^- = i_a^+ = 0 \end{array} \right\} \quad (2)$$

With equation (2), the four current references can be determined for the grid current control. However, as mentioned before, in one embodiment, it has to be ensured that these current references do not lead to any unacceptable DC-link voltage ripple due to active power pulsation. Looking at the active power being fed to the grid, the active power being fed to grid has 3 main components:
1. Average power P
2. Active power ripple due to reactive currents $p_r$
3. Active power ripple due to active currents $p_a$ The active power can be given by:

$$p = 1.5(v^+ i_a^+ + v^- i_a^-) + 1.5(-v^+ i_r^- + v^- i_r^+)\sin(2\omega t + \delta_2 - \delta_1) + \quad (3)$$
$$1.5(v^+ i_a^- + v^- i_a^+)\cos(2\omega t + \delta_2 - \delta_1)$$

whereby
the average power $P = 1.5 (v^+ i_a^+ + v^- i_a^-)$;
the active power ripple due to reactive currents $p_r = 1.5(-v^+ i_r^- + v^- i_r^+)$; and
the active power ripple due to active currents $p_a = 1.5 (v^+ i_a^- + v^- i_a^+)$.
the angles $\delta_1$ and $\delta_2$ are dependent on the positive and negative sequence components of the grid voltage.
wherein $v^+$ represents the positive sequence voltage, $v^-$ represents the negative sequence voltage, $i_r^+$ represents the positive sequence reactive current, $i_r^-$ represents the negative sequence reactive current, $i_a^+$ represents the positive sequence active current, and $i_a^-$ represents the positive sequence active current. In the equation given above, $p_r$ and $p_a$ represent the peak of the ripple which could be positive or negative. It is not the magnitude of the ripple. It is also referred to as active power ripple factor or value.

Since $I_a^+ = I_a^- = 0$, the average power P and the active power ripple due to active currents peak $p_a$ are zero but the active power ripple peak due to reactive currents $p_r$ is non-zero. In order to keep the DC-link voltage ripple in tight control (which may be seen to be very important from turbine operational point of view), it is in one embodiment ensured that the active power ripple peak due to reactive currents $p_r$ is equal to or less than the maximum allowed active power ripple $p_{max}$.

According to one embodiment, since $i_a^+ = i_a^- = 0$ as indicated in equation (2), the maximum allowed active power ripple ($p_{max}$) is obtained as follows and can be understood from FIG. 13.

Figure 13:
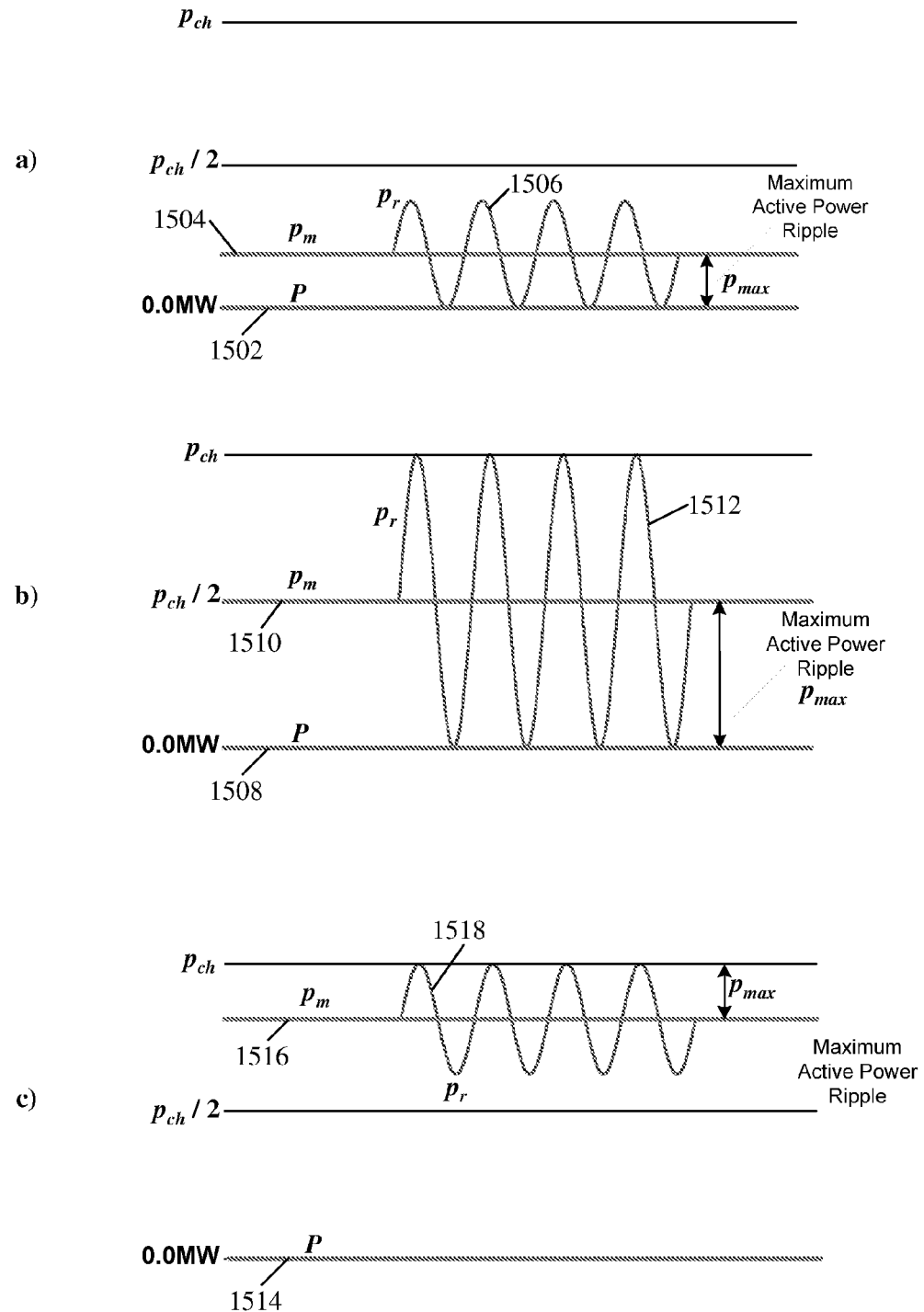
FIG. 13 shows drawings for determining a maximum allowed active power ripple according to an embodiment.

In FIG. 13, $p_m$ represents power generated by the generator (or machine power). $p_{ch}$ represents power that can be dissipated into chopper resistors.

Case 1 ($p_m < p_{ch}/2$)

If the generator power $p_m$ is less than half of the power which can be dissipated into the chopper resistors ($p_{ch}/2$), the maximum allowed active power ripple $p_{max}$ can be given as follows:

$$p_{max} = p_m \quad (4)$$

FIG. 13a shows the condition where $p_m < p_{ch}/2$. Line 1502 represents the average power P, line 1504 represents the generator power $p_m$, and curve 1506 represents the active power ripple due to reactive currents $p_r$.

Case 2 ($p_m \geq p_{ch}/2$)

If the generator power $p_m$ is more than half of the power which can be dissipated into the chopper resistors $p_{ch}/2$, the maximum allowed active power ripple $p_{max}$ can be given as follows:

$$p_{max} = p_{ch} - p_m \quad (5)$$

FIG. 13c shows the condition where $p_m > p_{ch}/2$. Line 1514 represents the average power P, line 1516 represents the generator power $p_m$, and curve 1518 represents the active power ripple due to reactive currents $p_r$.

FIG. 13b shows the condition where $p_m = p_{ch}/2$. Line 1508 represents the average power P, line 1510 represents the generator power $p_m$ which corresponds to $p_{ch}/2$, and curve 1512 represents the active power ripple due to reactive currents $p_r$.

Figure 14:
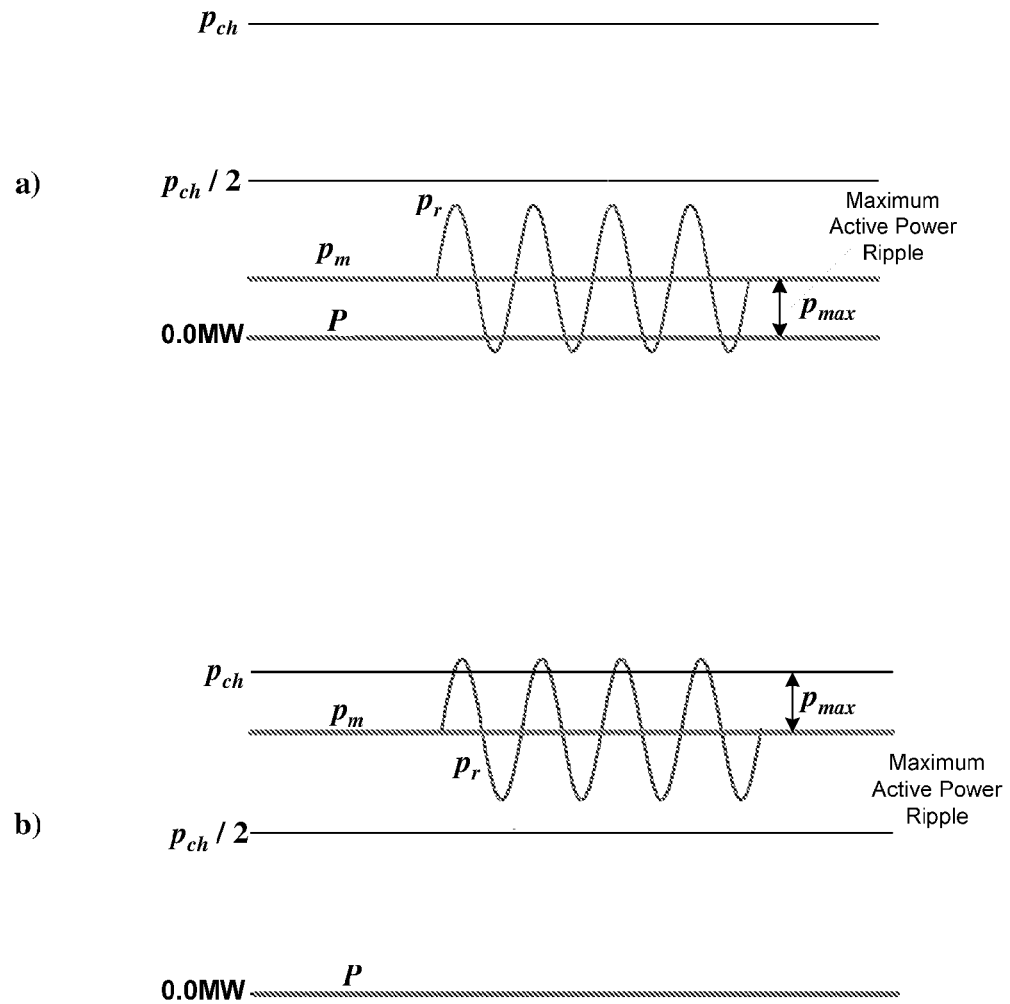
FIG. 14 shows drawings for determining a maximum allowed active power ripple with extra margins (some ripples allowed) according to an embodiment.

With this approach, substantially zero ripples can be obtained in the DC-link voltage. However, if some DC-link ripples (e.g. 5-10V) are allowed, the margins for the active power ripple can be slightly released as shown in FIG. 14 and as described below.

Case 1 ($p_m < p_{ch}/2$):

The maximum allowed active power ripple $p_{max}$ can be given as follows:

$$p_{max} = p_m + p_{ch} * \text{ripp} \quad (6)$$

FIG. 14a shows the condition where $p_m < p_{ch}/2$ with extra margins for the active power ripple. $p_{ch} * \text{ripp}$ represents the extra margins for the active power ripple.

Case 2 ($p_m \geq p_{ch}/2$)

The maximum allowed active power ripple $p_{max}$ can be given as follows:

$$p_{max} = p_{ch} - p_m + p_{ch} * \text{ripp} \quad (7)$$

FIG. 14b shows the condition where $p_m > p_{ch}/2$ with extra margins for the active power ripple. $p_{ch} * \text{ripp}$ represents the extra margins for the active power ripple. Here, ripp is for example a software programmable parameter.

Since the active power ripple due to reactive currents $p_r$ can be obtained from equation (3) and the maximum allowed active power ripple $p_{max}$ can be obtained based on any one of equations (4) to (7) depending on the wind turbine system specification and strategy, it is then checked if the active power ripple peak due to reactive currents $p_r$ exceeds the maximum allowed active power ripple $p_{max}$.

Figure 15:
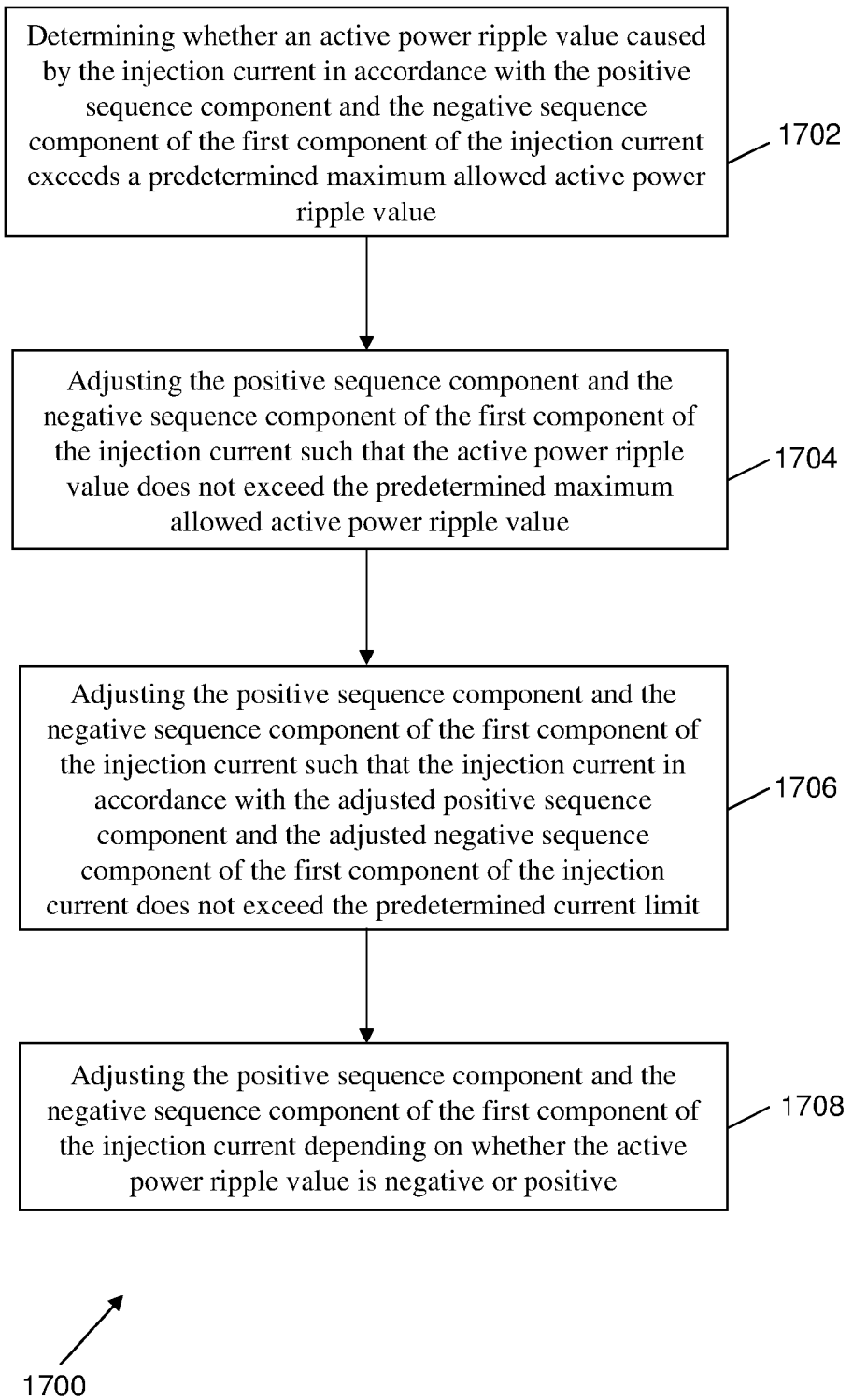
FIG. 15 shows a flowchart for determining an active power ripple caused by an injection current according to an embodiment.

FIG. 15 shows a flowchart 1700 for determining an active power ripple peak caused by an injection current. At 1702, it is determined whether an active power ripple peak caused by the injection current in accordance with the positive sequence component and the negative sequence component of the first component of the injection current exceeds a predetermined power limit. If it has been determined that the active power ripple peak exceeds the predetermined power limit, the positive sequence component and the negative sequence component are adjusted at 1704 such that the active power ripple peak does not exceed the predetermined power limit (i.e. predetermined maximum allowed active power ripple). At 1706, the positive sequence component and the negative sequence component of the first component of the injection current are adjusted such that the injection current in accordance with the adjusted positive sequence component and the adjusted negative sequence component of the first component of the injection current does not exceed the predetermined current limit. The positive sequence component and the negative sequence component of the first component of the injection current may be adjusted such that the injection current in accordance with the adjusted positive sequence component and the adjusted negative sequence component of the first component of the injection current does not exceed the predetermined current limit only when the positive and negative sequence active currents are zero, i.e. $I_a^+ = I_a^- = 0$. At 1708, the positive sequence component and the negative sequence component of the first component of the injection current are readjusted depending on whether the active power ripple value is negative or positive.

In one embodiment, the active power ripple may be the active power ripple peak due to reactive currents $p_r$. The predetermined power limit may be the maximum allowed active power ripple $p_{max}$. The maximum allowed active power ripple value may depend on at least one of the power output from a generator of the power generation system, the resistance value of a chopper resistor of the converter, the DC-link voltage, an allowed DC-link ripple voltage, the power grid voltage, the first component of the injection current and the second component of the injection current. The positive sequence component and the negative sequence component of the first component of the injection current may be the positive sequence component and the negative sequence component of the reactive injection current. The predetermined current limit may be the maximum converter current $I_m$.

In more detail, if the active power ripple peak due to reactive currents $p_r$ is less than the maximum allowed active power ripple $p_{max}$, the currents calculated by equation (2) do not cause any trouble for the DC-link voltage ripples and can be allowed as it is. However, if the active power ripple peak due to reactive currents $p_r$ is more than the maximum allowed active power ripple $p_{max}$, the currents calculated by equation (2) have to be modified such that the active power ripple peak is limited to $p_{max}$ and the sum of the positive sequence reactive current $i_r^+$ and the negative sequence reactive current $i_r^-$ equal to $I_m$ for the best utilization of the converter current capability.

From equation (3), it can be observed that the magnitude of the active power ripple peak due to reactive currents $p_r$ (i.e. $1.5(-v^+i_r^-+v^-i_r^-)$) is dependent on $i_r^+$ and $i_r^-$. Thus, depending on $i_r^+$ and $i_r^-$, $p_r$ can be negative or positive. The modification of $i_r^+$ and $i_r^-$ is different for $p_r<0$ and $p_r>0$.

If $p_r<0$, the reactive currents $i_r^+$ and $i_r^-$ are modified as follows:

$$I_r^+ = \frac{I_m \cdot |v^+| - p_{max}/1.5}{|v^+|+|v^-|} \\ I_r^- = I_m - I_r^+ \Bigg\} \quad (8)$$

If $p_r>0$, the reactive currents $i_r^+$ and $i_r^-$ are modified as follows:

$$I_r^+ = \frac{I_m \cdot |v^+| + p_{max}/1.5}{|v^+|+|v^-|} \\ I_r^- = I_m - I_r^+ \Bigg\} \quad (9)$$

With these modifications in the reactive currents, there will not be any problem with the active power ripples.

The above description can be summarized in the following steps:

1. Set initial currents using equation (2).
2. Find active power ripple peak due to reactive currents $p_r = 1.5(-v^+i_r^-+v^-i_r^-)$.
3. Find maximum allowed active power ripple $p_{max}$ using any one of equations (4) to (7).
4. No modifications in currents if $p_r<p_{max}$.
5. If $p_r>p_{max}$, alter $i_r^+$ and $i_r^-$ using equation (8) or (9) to ensure limit on power ripple and converter currents.

Figure 16:
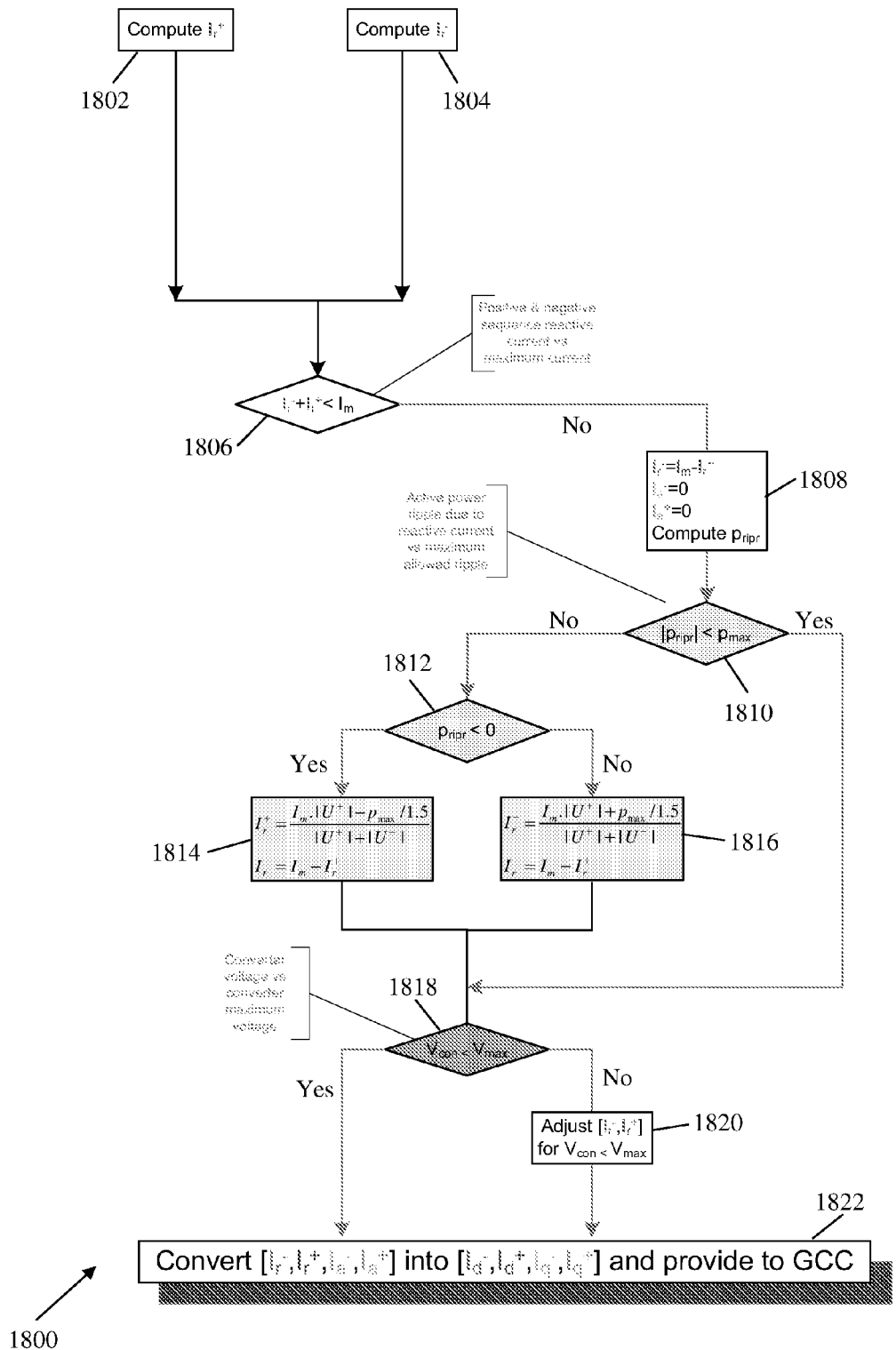
FIG. 16 shows a detailed flowchart for determining an injection current of a power generation system according to an embodiment.

FIG. 16 shows a detailed flowchart 1800 for determining an injection current of a power generation system according to one embodiment. FIG. 16 illustrates the sequence 212 of the flowchart 200 shown in FIG. 2. At 1802, a positive sequence reactive injection current $I_r^+$ is determined as described above. At 1804, a negative sequence reactive injection current $I_r^-$ is determined as described above. At 1806, it is determined whether the sum of the positive sequence reactive injection current $I_r^+$ and the negative sequence reactive injection current $I_r^-$ is less than the maximum converter current $I_m$. If it is determined that the sum of the positive sequence reactive injection current $I_r^+$ and the negative sequence reactive injection current $I_r^-$ is more than the maximum converter current $I_m$, the negative sequence reactive injection current $I_r^-$ is set to a value of $(I_m-I_r^+)$, the positive sequence active injection current $I_a^+$ and the negative sequence active injection current $I_a^-$ are set to zero, and the active power ripple due to reactive currents $p_r$ is determined at 1808. At 1810, it is determined whether the magnitude of the active power ripple peak due to reactive currents $p_r$ is less that the maximum allowed active power ripple $p_{max}$.

If it is determined that the active power ripple peak due to reactive currents $p_r$ is more that the maximum allowed active power ripple $p_{max}$, it is then determined whether the active power ripple value due to reactive currents $p_r$ is less than zero at 1812. If it is determined that the active power ripple value due to reactive currents $p_r$ is less than zero, the positive sequence reactive injection current $I_r^+$ is adjusted using $$I_r^+ = \frac{I_m \cdot |v^+| - p_{max}/1.5}{|v^+|+|v^-|},$$

and the negative sequence reactive injection current $I_r^-$ is adjusted using $I_r^-=I_m-I_r^+$ at 1814. If it is determined that the active power ripple factor due to reactive currents $p_r$ is more than zero, the positive sequence reactive injection current $I_r^+$ is adjusted using $$I_r^+ = \frac{I_m \cdot |v^+| + p_{max}/1.5}{|v^+|+|v^-|},$$

and the negative sequence reactive injection current $I_r^-$ is adjusted using $I_r^-=I_m-I_r^+$ at 1816.

The flowchart 1800 then proceeds to 1818 where it is determined whether a grid side converter voltage $V_{con}$ according to the injection current in accordance with the adjusted positive sequence reactive injection current $I_r^+$ and the adjusted negative sequence reactive injection current $I_r^-$ exceeds a predetermined converter voltage reference limit $V_{max}$. This can ensure that the grid side power converter in a linear mode of modulation. If it is determined that the grid side converter voltage $V_{con}$ exceeds the predetermined converter voltage limit $V_{max}$, the adjusted positive sequence reactive injection current $I_r^+$ and the adjusted negative sequence reactive injection current $I_r^-$ are further adjusted at 1820 such that the grid side converter voltage $V_{con}$ does not exceed the converter voltage limit $V_{max}$. The adjusted positive sequence reactive injection current $I_r^+$ and the adjusted negative sequence reactive injection current $I_r^-$ are further adjusted such that the injection current in accordance with the further adjusted positive sequence reactive injection current $I_r^+$ and the further adjusted negative sequence reactive injection current $I_r^-$ does not exceed the predetermined current limit $I_m$.

Referring back to 1810, if it is determined whether the active power ripple peak due to reactive currents $p_r$ is less that the maximum allowed active power ripple $p_{max}$, the flowchart 1800 proceeds directly from 1810 to 1818. Therefore, the positive sequence reactive injection current $I_r^+$ and the negative sequence reactive injection current $I_r^-$ are not adjusted if it is determined whether the active power ripple peak due to reactive currents $p_r$ is less that the maximum allowed active power ripple $p_{max}$. At 1818, it is determined whether the grid side converter voltage $V_{con}$ according to the injection current in accordance with the positive sequence reactive injection current $I_r^+$ and the negative sequence reactive injection current $I_r^-$ exceeds a predetermined converter voltage reference limit $V_{max}$. This can ensure that the grid side power converter operates in a linear mode of modulation.

If it is determined that the grid side converter voltage $V_{con}$ exceeds the predetermined converter voltage limit $V_{max}$, the positive sequence reactive injection current $I_r^+$ and the negative sequence reactive injection current $I_r^-$ are adjusted such that the grid side converter voltage $V_{con}$ does not exceed the converter voltage limit $V_{max}$ at 1820. The positive sequence reactive injection current $I_r^+$ and the negative sequence reactive injection current $I_r^-$ are adjusted such that the injection current in accordance with the adjusted positive sequence reactive injection current $I_r^+$ and the adjusted negative sequence reactive injection current $I_r^-$ does not exceed the predetermined current limit $I_m$.

At 1822, the positive sequence reactive injection current $I_r^+$, the negative sequence reactive injection current $I_r^-$, the positive sequence active injection current $I_a^+$ and the negative sequence active injection current $I_a^-$ are converted into currents references in a rotating frame (i.e. $I_q^+$, $I_q^-$, $I_d^+$ and $I_d^-$) respectively, and the $I_d^+$, $I_d^-$, $I_q^+$ and $I_q^-$ are provided to a grid current controller/grid side converter current control.

Figure 17:
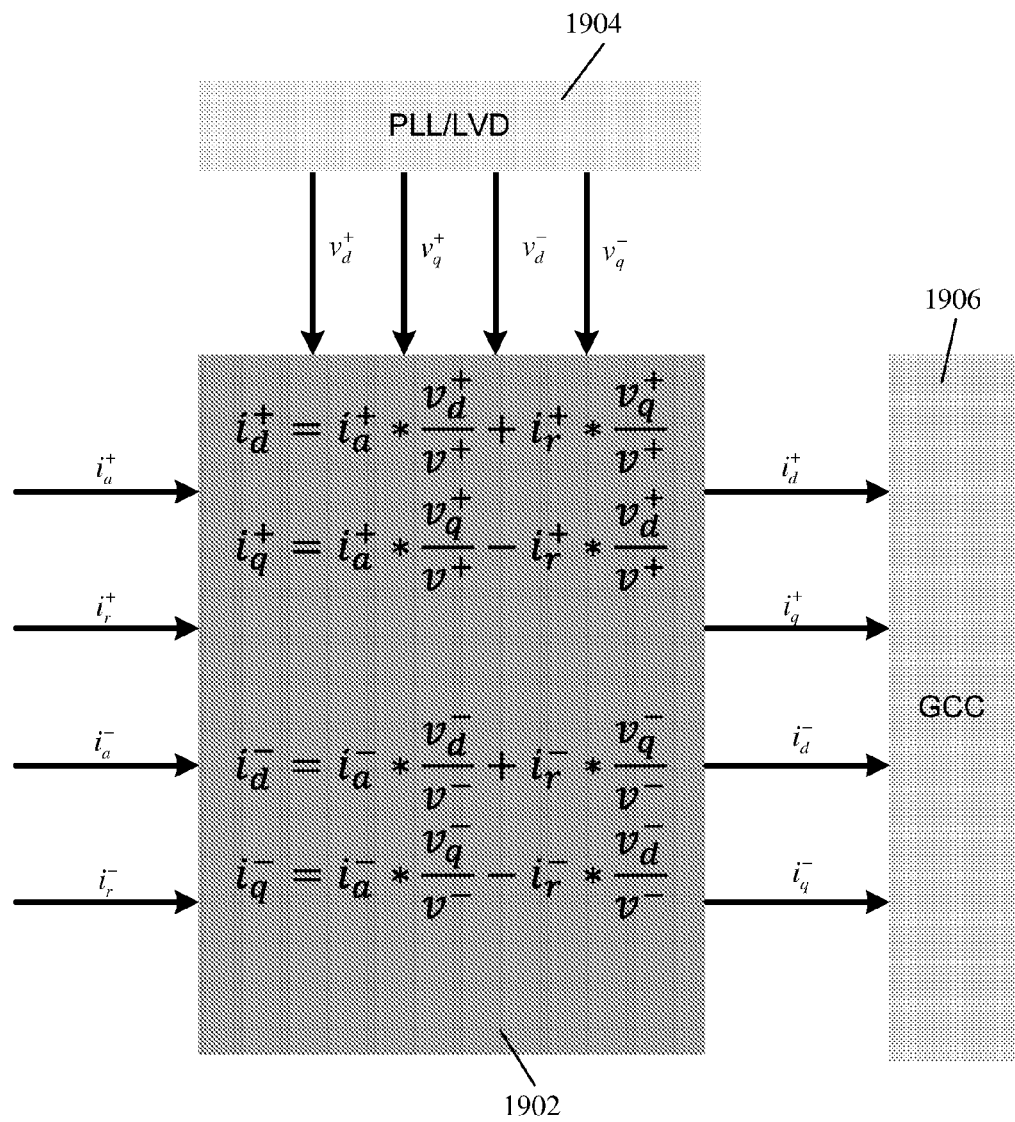
FIG. 17 shows a schematic diagram of a system for converting positive and negative sequence components of active and reactive injection currents into currents in a rotating frame.

The conversion of the positive sequence reactive injection current $I_r^+$, the negative sequence reactive injection current $I_r^-$, the positive sequence active injection current $I_a^+$ and the negative sequence active injection current $I_a^-$ into currents references in a rotating frame (i.e. $I_q^+$, $I_q^-$, $I_d^+$ and $I_d^-$) respectively is illustrated in FIG. 17. The positive sequence reactive injection current $I_r^+$, the negative sequence reactive injection current $I_r^-$, the positive sequence active injection current $I_a^+$ and the negative sequence active injection current $I_a^-$ may be inputted into a processing unit 1902. The voltages $v_d^+$, $v_d^-$, $v_q^+$ and $v_q^-$ in a rotating frame may be transmitted from a phase locked loop to voltage detection unit (PLL/LVD) 1904 to the processing unit 1902. The processing unit 1902 may then determine $I_q^+$, $I_q^-$, $I_d^+$ and $I_d^-$ based on the following respective equations (10) to (13):

$$I_q^+ = I_a^+ * \frac{v_q^+}{v^+} - I_r^+ * \frac{v_d^+}{v^+} \qquad (10)$$

$$I_q^- = I_a^- * \frac{v_q^-}{v^-} - I_r^- * \frac{v_d^-}{v^-} \qquad (11)$$

$$I_d^+ = I_a^+ * \frac{v_d^+}{v^+} + I_r^+ * \frac{v_q^+}{v^+} \qquad (12)$$

$$I_d^- = I_a^- * \frac{v_d^-}{v^-} + I_r^- * \frac{v_q^-}{v^-} \qquad (13)$$

The determined $I_d^+$, $I_d^-$, $I_q^+$ and $I_q^-$ may then be transmitted from the processing unit 1902 to a grid current controller 1906.

Referring back to FIG. 16, if it is determined that the grid side converter voltage $V_{con}$ does not exceed the converter voltage limit $V_{max}$ at 1818, the flowchart 1800 proceeds directly from 1818 to 1822.

The above-described method for determining an injection current of a power generation system can ensure that the actual currents will not exceed the converter current limits, the DC-link ripple will remain within the prescribed limit, and that the power converter operate in a linear mode of modulation. The above-described method can provide a maximum use of converter current capacity. By using the above-described method, the machine side active power/torque is substantially not affected. The above-described method uses a simple computation and is applicable to all kinds of grid faults.

The above-described method for determining an injection current of a power generation system is carried out for the situation when $I_r^+ + I_r^- > I_m$. The following describes a method for determining an injection current of a power generation system for the situation when $I_r^+ + I_r^- < I_m$.

If the Sum of the Positive Sequence Reactive Current $I_r^+$ and the Negative Sequence Reactive Current $I_r^-$ is Smaller than a Maximum Current Limit ($I_r^+ + I_r^- < I_m$)

Figure 18:
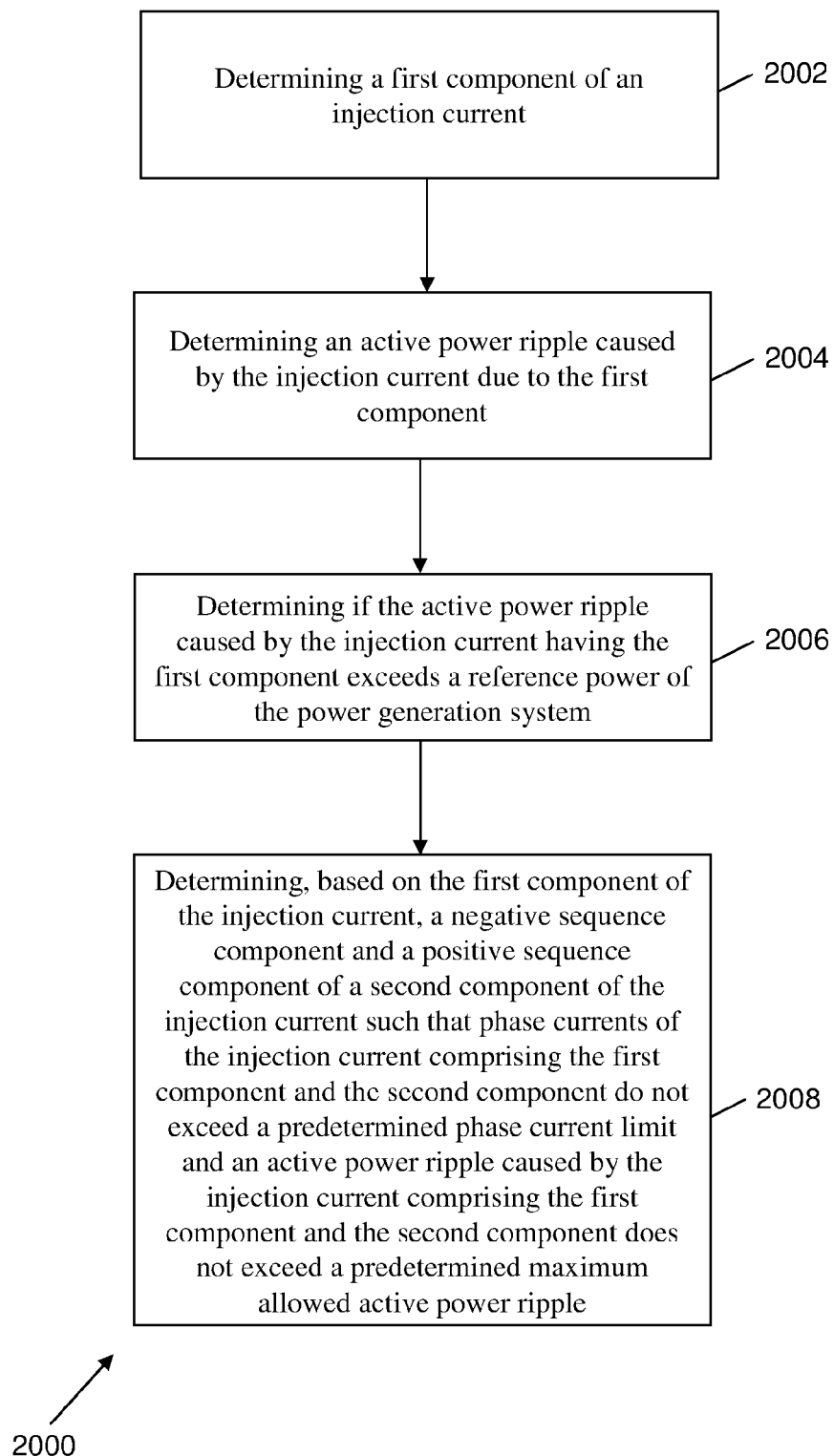
FIG. 18 shows a flowchart of a method for addressing an asymmetrical grid fault in a power grid connected to a power generation system according to an embodiment.

As mentioned above with reference to FIG. 2, the injection current is determined using sequence 210 when it is determined that the sum of the positive sequence reactive current $I_r^+$ and the negative sequence reactive current $I_r^-$ is smaller than a maximum current limit. FIG. 18 shows a flowchart 2000 of a process performed in sequence 210 of FIG. 2 for determining the injection current of a power generation system (e.g. a method for addressing an asymmetrical grid fault in a power grid connected to a power generation system). At 2002, a first component of an injection current is determined. At 2004, an active power ripple peak caused by the injection current due to the first component is determined. At 2006, it is determined if the active power ripple peak caused by the injection current having the first component exceeds a reference power of the power generation system. At 2008, if it is determined that the active power ripple caused by the injection current having the first component is below the reference power of the power generation system, a negative sequence component and a positive sequence component of a second component of the injection current is determined based on the first component of the injection current such that phase currents of the injection current having the first component and the second component do not exceed a predetermined phase current limit and an active power ripple peak caused by the injection current having the first component and the second component does not exceed a predetermined maximum allowed active power ripple.

In one embodiment, the first component is a reactive injection current. The second component is an active injection current. The reference power of the power generation system is a power generated by a generator of the power generation system.

Figure 19:
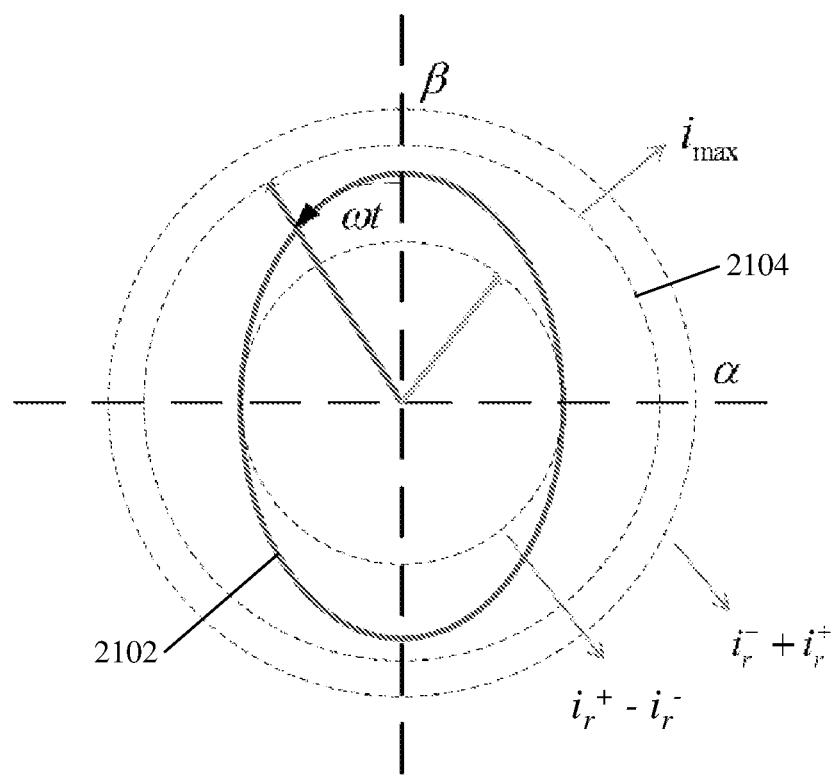
FIG. 19 shows that a trajectory of current $(I_r^+ + I_r^-)$ is smaller than a trajectory of a maximum limit circle $I_m$.

FIG. 19 shows that a trajectory 2102 of the current ($I_r^+ + I_r^-$) is smaller than a trajectory 2104 of the maximum current limit circle $I_m$. If the trajectory 2102 of the current ($I_r^+ + I_r^-$) is less than $I_m$, it may signify that (i) less extreme grid faults i.e. fault far from the wind farm; (ii) current references $i_r^+$ and $i_r^-$ can be allowed as they are; and (iii) some active currents can be pumped into the grid.

Figure 20:
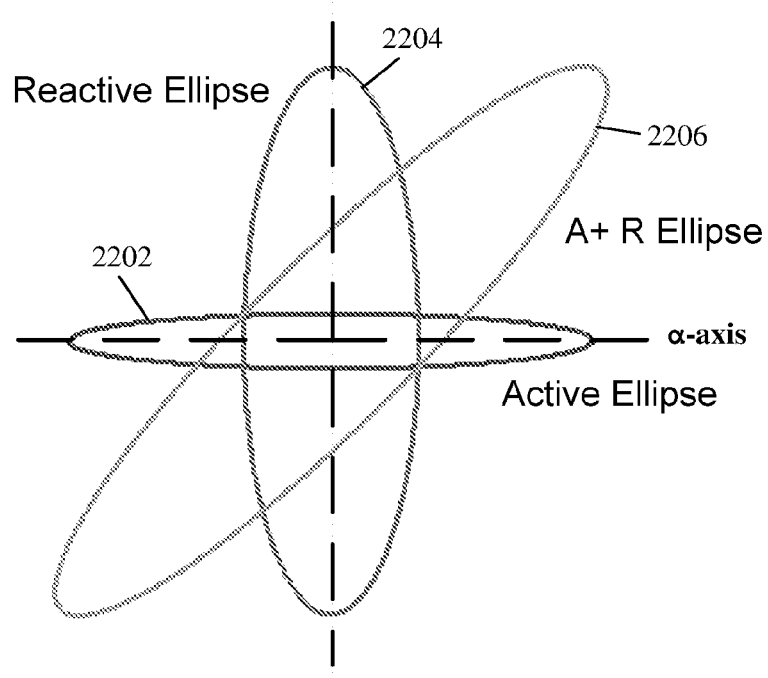
FIG. 20 shows a trajectory of an active current, a trajectory of a reactive current, and a combined trajectory of the active current and the reactive current for a given scenario.
Figure 21:
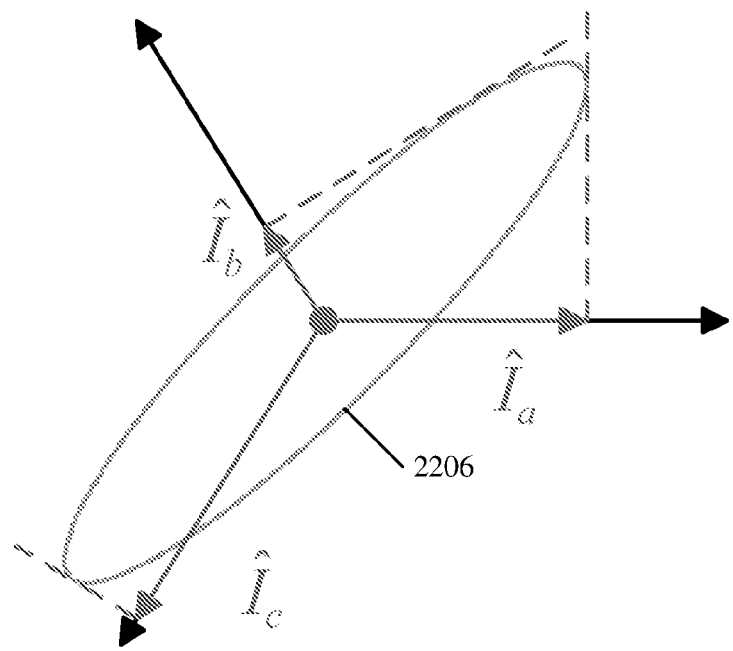
FIG. 21 shows maximum allowed currents in each phase obtained by making projections from a combined current trajectory on the a, b and c axes.

For nonzero value of active and reactive currents, FIG. 20 shows the trajectory 2202 of the active current and the trajectory 2204 of reactive current. The ellipse 2206 is the combined trajectory of the active and reactive currents. The ellipse 2206 can make any angle with the α-axis depending on the type of fault, the faulty phase and the dip level. The maximum allowed currents ($i_{max}$) in each phase a, b and c can be found by making projections of this ellipse 2206 on the three axes a, b and c, as shown in FIG. 21. By the projections on the three axes, 3 current limit inequality equations can be obtained for phases a, b and c.

Figure 22A:
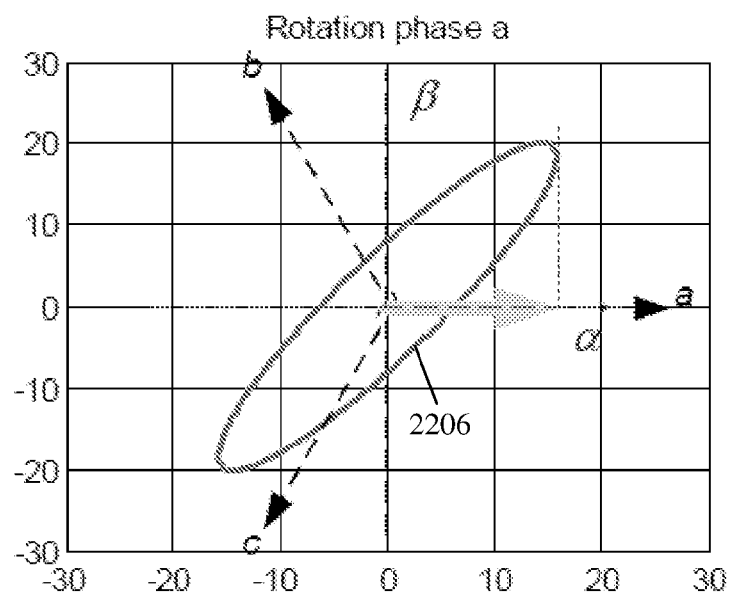
FIGS. 22a, 22b and 22c shows significance of maximum allowed currents in each phase obtained by making projections from a combined trajectory of an active current and a reactive current.
Figure 22B:
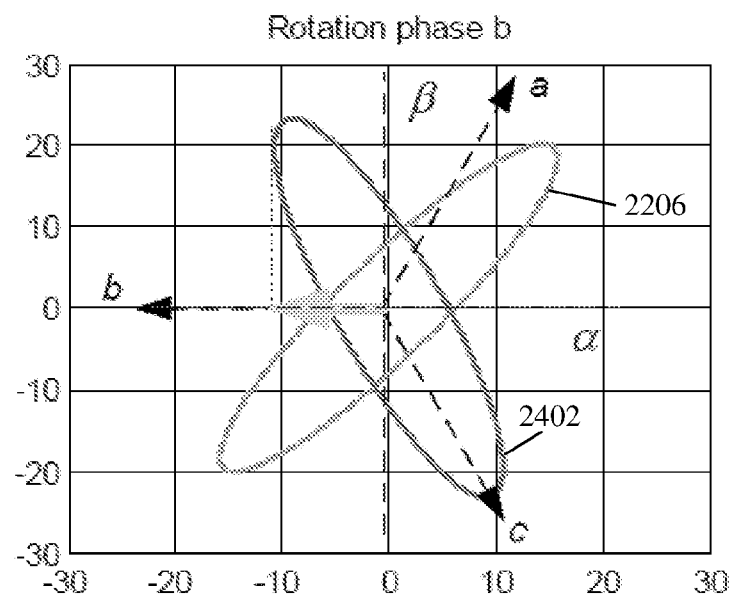
Figure 22C:
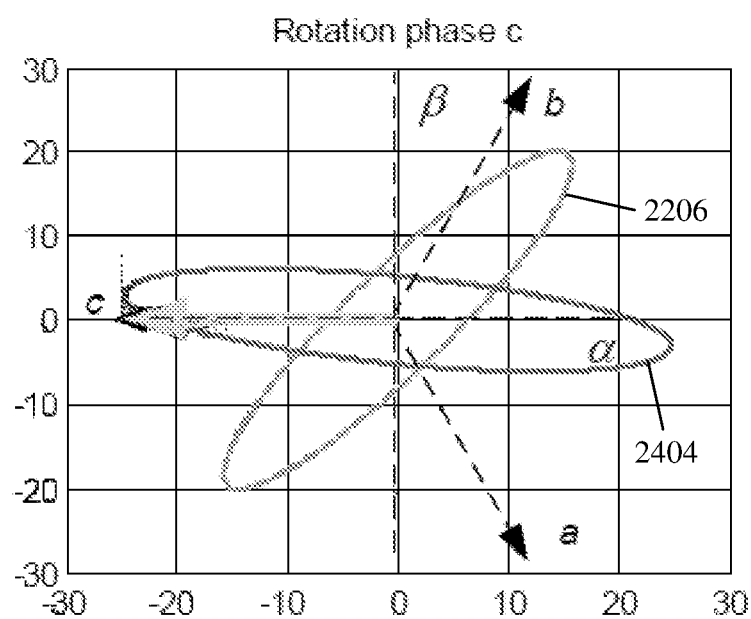

In more detail, FIG. 22a shows that the a-axis is aligned with the α-axis. The maximum value of the phase a current is equal to the maximum value of the ellipse 2206 projection on the α-axis. Therefore, the maximum values of the phase b current and the phase c current can be obtained in a similar manner by rotating the ellipse 2206. FIG. 22b shows the ellipse 2206 is rotated by π/3 radians to a position 2402. The b-axis is aligned with the α-axis. The maximum value of the phase b current is equal to the maximum value of the rotated ellipse 2402 projection on the α-axis. FIG. 22c shows the ellipse 2206 is rotated by −π/3 radians to a position 2404. The c-axis is aligned with the α-axis. The maximum value of the phase c current is equal to the maximum value of the rotated ellipse 2404 projection on the α-axis. Therefore, 3 current limit inequality equations (A), (B) and (C) can be obtained for phase a, b and c currents respectively.

As previously mentioned, according to one embodiment, it has to be ensured that the three objectives described above are met. Thus, according to one embodiment, it is ensured that the current references do not lead to any unacceptable DC link ripple.

The average power P, the active power ripple due to active currents $p_a$, and the active power ripple due to reactive currents $p_r$ could be potentially nonzero. Thus, it should be ensured that active power ripple p does not exceed the maximum allowed active power ripple $p_{max}$.

Figure 23:
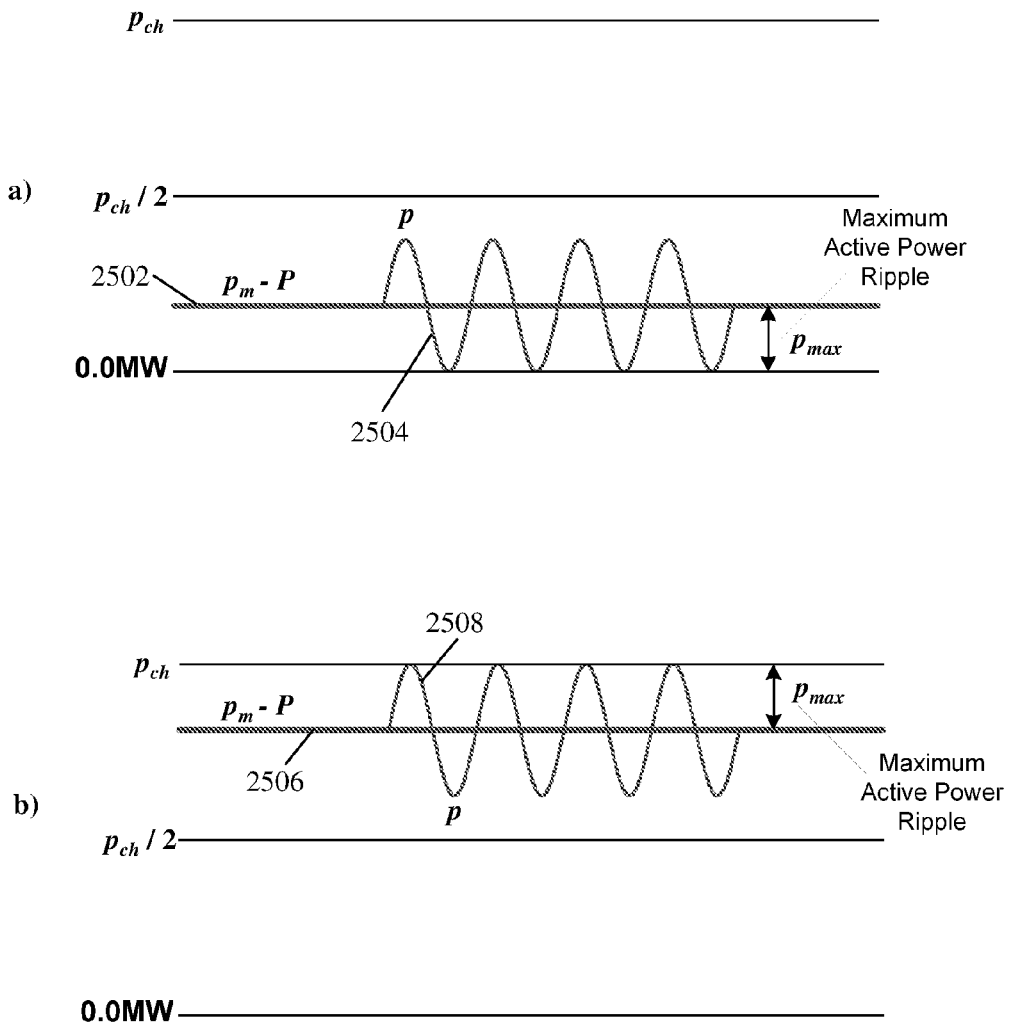
FIG. 23 shows drawings for establishing relationship between maximum allowed active power ripple, power output of the generator, chopper power and the average power output to the grid in two extreme situations.

FIG. 23 shows the situation where active power is being fed into the grid. In FIG. 23, $p_m$ represents power generated by the generator (or machine power), ($p_m$–P) represents the average power being dumped into chopper resistors across the DC link, p represents the active power ripple, and $p_{ch}$ represents power that can be dissipated into chopper resistors.

FIG. 23a shows a scenario where the value of ($p_m$–P) is low (e.g. when the machine power $p_m$ is low or nearly all the power is pumped to the grid). Line 2502 represents the average power being dumped into chopper resistors across the DC link ($p_m$–P), and curve 2504 represents the active power ripple p. Two inequalities (D) and (E) can be obtained which are a function of $I_r^+$, $I_r^-$, $I_a^+$ and $I_a^-$ $p_{ch}$ and $p_m$ which establish a relation between the active power ripple p, the machine power, the grid power, the chopper power capacity, grid voltages and current at low/high machine power conditions. In general, these inequalities establish a relation between the four current references ($I_r^+$, $I_r^-$, $I_a^+$ and $I_a^-$), grid voltages, machine power and the chopper power. A physical interpretation of this equation is that when setting the four current references, the availability of the machine power and rating of the chopper power should also be considered to avoid excessive active power ripples.

Since $I_r^+$ and $I_r^-$ are known, $I_a^+$ and $I_a^-$ are determined such that the five inequality equations (A), (B), (C), (D) and (E) are satisfied. The currents determined with the five inequalities will not exceed the phase current limit and will not create problem for the DC link voltage.

Placing all the known parameters into the five inequalities will lead to five equations with two unknowns, i.e. $I_a^+$ and $I_a^-$. All the five inequalities are quadratic equations and need to be solved separately. The values of $I_a^+$ and $I_a^-$ which can fulfill the five inequality equations enable the three objectives described above to be met. A quadratic equation with two variables may lead to a number of finite solutions. The chosen solution depends on the system performance requirements and optimization.

Further, for the situation $I_r^+ + I_r^- < I_m$, it is first checked if the active power ripple peak due to reactive current $p_r$ is more than the machine power (e.g. power generated by the generator) $p_m$. If it is determined that the active power ripple caused by the injection current having a first component exceeds the reference power of the power generation system, a negative sequence component and a positive sequence component of a second component of the injection current is set to a predetermined value. A negative sequence component of the first component of the injection current may be adjusted depending on whether the active power ripple value is negative or positive.

In one embodiment, the first component of the injection current is a reactive injection current. The second component of the injection current is an active injection current. The reference power of the power generation system is a power generated by a generator of the power generation system. The predetermined value is zero.

Figure 24:
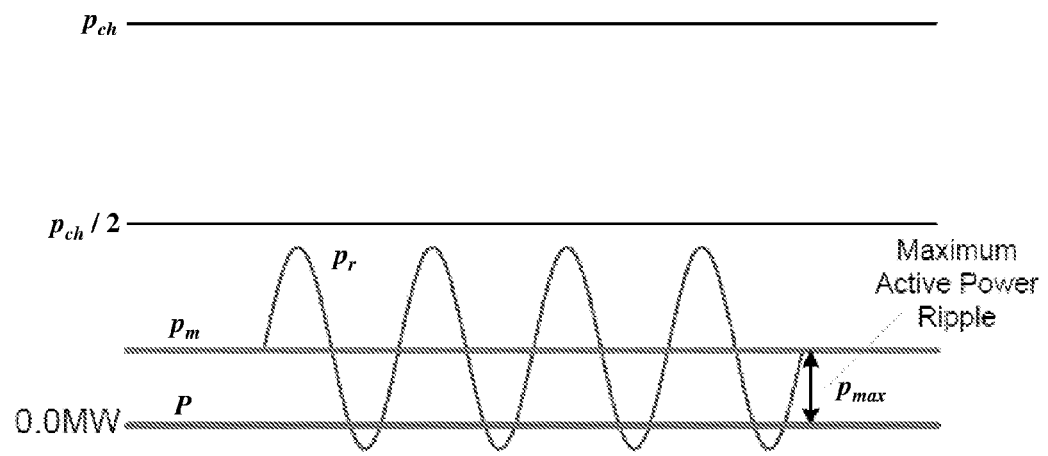
FIG. 24 shows a situation where an active power ripple due to reactive current is more than a machine power according to an embodiment.

The situation where the active power ripple peak due to reactive current $p_r$ is more than the machine power $p_m$ is shown in FIG. 24. If the active power ripple due to reactive current $p_r$ is more than the machine power $p_m$, the active current references $i_a^+$ and $i_a^-$ are set to zero. The negative sequence reactive current reference is set such that the active power ripple due to reactive current is equal to machine power, i.e. $p_r = p_m$. This can ensure no trouble for the DC link voltage ripple.

From equation (3), it can be observed that the magnitude of the active power ripple due to reactive currents $p_r$ (i.e. i.e. $1.5(-v^+i_r^- + v^-i_r^+)$)) is dependent on $i_r^+$ and $i_r^-$. Thus, depending on $i_r^+$ and $i_r^-$, $p_r$ can be negative or positive. The modification of $i_r^-$ is different for $p_r < 0$ and $p_r > 0$.

If $p_r < 0$, the reactive current $i_r^-$ is modified as follows:

$$I_r^- = \frac{I_r^+ \cdot |v^-| + p_m/1.5}{|v^+|} \quad (14)$$

If $p_r > 0$, the reactive current $i_r^-$ is modified as follows:

$$I_r^- = \frac{I_r^+ \cdot |v^-| - p_m/1.5}{|v^+|} \quad (15)$$

With these modifications in the reactive currents, there will not have any problem with the active power ripples or the DC link voltage ripples.

Figure 25:
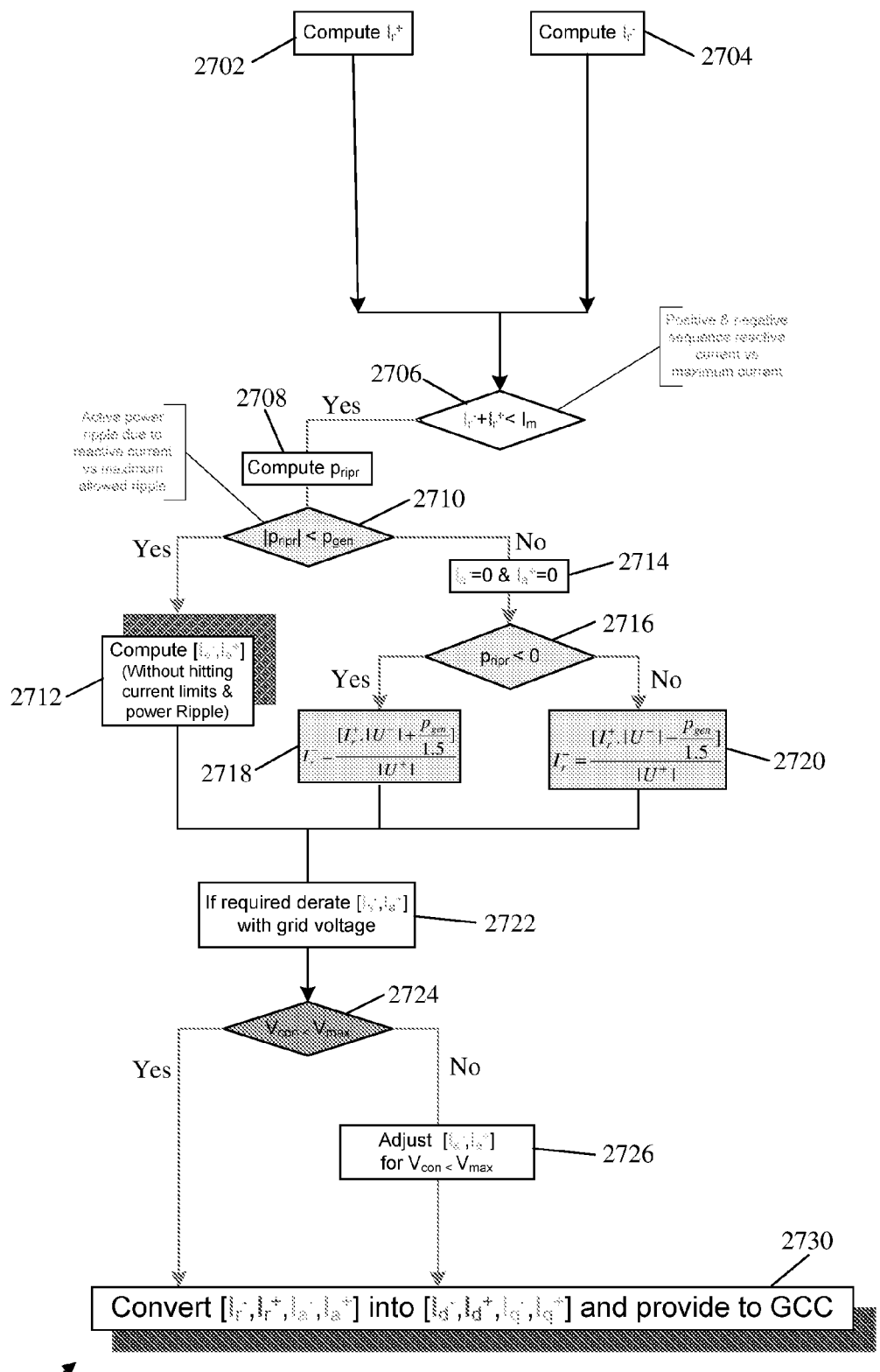
FIG. 25 shows a detailed flowchart for determining an injection current of a power generation system according to an embodiment.

FIG. 25 shows a detailed flowchart 2700 for determining an injection current of a power generation system. FIG. 25 illustrates the sequence 210 of the flowchart 200 shown in FIG. 2. At 2702, a positive sequence reactive injection current $I_r^+$ is determined as described above. At 2704, a negative sequence reactive injection current $I_r^-$ is determined as described above. At 2706, it is determined whether the sum of the positive sequence reactive injection current $I_r^+$ and the negative sequence reactive injection current $I_r^-$ is less than the maximum converter current $I_m$. If it is determined that the sum of the positive sequence reactive injection current $I_r^+$ and the negative sequence reactive injection current $I_r^-$ is less than the maximum converter current $I_m$, the active power ripple peak due to reactive currents $p_r$ is determined at 2708.

At 2710, it is determined whether the active power ripple due to reactive currents $p_r$ is less than the machine power $p_m$. If it is determined that the active power ripple peak due to reactive currents $p_r$ is less than the machine power $p_m$, the positive sequence active injection current $I_a^+$ and the negative sequence active injection current $I_a^-$ are determined at 2712 such that the current limit $I_m$ and the maximum allowed active power ripple $p_{max}$ are not exceeded, described in previous embodiments.

If it is determined that the active power ripple due to reactive currents $p_r$ is more than the machine power $p_m$, the positive sequence active injection current $I_a^+$ and the negative sequence active injection current $I_a^-$ are set to zero at 2714. At 2716, it is determined whether the active power ripple due to reactive currents $p_r$ is less than zero.

If it is determined that the active power ripple peak due to reactive currents $p_r$ is less than zero, the negative sequence reactive injection current $I_r^-$ is adjusted using $$I_r^- = \frac{I_r^+ \cdot |v^-| + p_m/1.5}{|v^+|}$$

at 2718. If it is determined that the active power ripple peak due to reactive currents $p_r$ is more than zero, the negative sequence reactive injection current $I_r^-$ is adjusted using $$I_r^- = \frac{I_r^+ \cdot |v^-| - p_m/1.5}{|v^+|} \text{ at } 2720.$$

The flowchart proceeds to 2722 from 2712, 2718 or 2720. At 2722, the positive sequence active injection current $I_a^+$ and the negative sequence active injection current $I_a^-$ are derated, if required. In one embodiment, it may be determined whether it is required to derate the positive sequence active injection current $I_a^+$ and the negative sequence active injection current $I_a^-$ (e.g. the second component of the injection current). The positive sequence active injection current $I_a^+$ and the negative sequence active injection current $I_a^-$ may be derated if it has been determined that it is required to derate the second component of the injection current. At 2724, it is determined whether a grid side converter voltage $V_{con}$ according to the injection current in accordance with the positive sequence reactive injection current $I_a^+$, the negative sequence reactive injection current $I_a^-$ the positive sequence reactive injection current $I_r^+$ and the negative sequence reactive injection current $I_r^-$ exceeds a predetermined converter voltage limit $V_{max}$. This can ensure that the power converter of the wind turbine operates in a linear mode of modulation.

If it is determined that the grid side converter voltage $V_{con}$ exceeds the predetermined converter voltage limit $V_{max}$, the positive sequence reactive injection current $I_a^+$ and the negative sequence reactive injection current $I_a^-$ are adjusted such that the grid side converter voltage $V_{con}$ does not exceed the converter voltage limit $V_{max}$ at 2726. At 2728, the positive sequence reactive injection current $I_r^+$, the negative sequence reactive injection current $I_r^-$, the positive sequence active injection current $I_a^+$ and the negative sequence active injection current $I_a^-$ are converted into current references in a rotating frame (i.e. $I_q^+, I_q^-, I_d^+$ and $I_d^-$), and the $I_q^+, I_q^-, I_d^+$ and $I_d^-$ are provided to a grid current controller/grid side converter current control. The way that the positive sequence reactive injection current $I_r^+$, the negative sequence reactive injection current $I_r^-$, the positive sequence active injection current $I_a^+$ and the negative sequence active injection current $I_a^-$ are converted into $I_q^+, I_q^-, I_d^+$ and $I_d^-$ respectively are described above with reference to FIG. 17.

Referring back to 2724, if it is determined that the grid side converter voltage $V_{con}$ does not exceed the converter voltage limit $V_{max}$, the flowchart proceeds directly from 2724 to 2728.

The above-described method for determining an injection current of a power generation system can ensure that the actual currents will not exceed the converter current limits, the DC-link ripple will remain within the prescribed limit, and that the power converter operate in a linear mode of modulation. The above-described method can provide a maximum use of converter current capacity. By using the above-described method, the machine side active power is not affected. The above-described method uses a simple computation and is applicable to all kinds of grid faults. The above-described method can also be used in grid voltage imbalance conditions. It can be used for the voltage unbalance case where the positive and negative sequence reactive currents $(I_r^+, I_r^-)$ have been determined and the positive and negative sequence active currents $(I_a^+, I_a^-)$ are calculated based on the amount of active power to be sent out and other constraints described above.

Active Power/Current Priority

For active power/current priority, the positive and negative sequence active currents $(I_a^+, I_a^-)$ are first determined and the positive and negative sequence reactive currents $(I_r^+, I_r^-)$ are then calculated while meeting the three objectives as described above. Therefore, for active power/current priority, predetermination of the positive and negative sequence components of the reactive injection current $(I_r^+, I_r^-)$ is not required.

When the active current/power is a high priority, the power which will be dumped into the chopper will be significantly small. This is similar to the scenario illustrated in FIG. 23a.

After the positive and negative sequence active currents $(I_a^+, I_a^-)$ are determined, the positive and negative sequence reactive currents $(I_r^+, I_r^-)$ are calculated. For active power/current priority, the reactive currents should be set in a manner such that they do not cause any active power ripple. As such, the active power ripple due to reactive currents $p_r = 1.5 (-v^+ i_r^- + v^- i_r^-)$ is equal to zero. As such, a simple relationship between $I_r^+$ and $I_r^-$ can be derived and can be represented by the following equation:

$$i_r^- = \frac{v^-}{v^+} i_r^+ \tag{16}$$

In asymmetrical fault condition, the three current inequality equations (A), (B) and (C) apply irrespective of the power/current priority. Therefore, each of the three current inequality equations (A), (B) and (C) can be used with equation (16) to calculate $I_r^+$ and $I_r^-$ for active power/current priority.

Determining the $I_r^+$ and $I_r^-$ in this manner can ensure that the converter current limits will not be exceeded. Further, active power transfer to the grid can be maximized without exceeding the active power ripples limits or creating trouble for the DC link voltage ripples.

Generally, according to one embodiment, a first component of an injection current may be determined. An active power ripple caused by the injection current having the first component may be determined. It may be determined if the active power ripple caused by the injection current having the first component exceeds a reference power of the power generation system. If it is determined that the active power ripple caused by the injection current having the first component is below the reference power of the power generation system, a negative sequence component and a positive sequence component of a second component of the injection current may be determined based on the first component of the injection current such that phase currents of the injection current having the first component and the second component do not exceed a predetermined phase current limit and an active power ripple caused by the injection current comprising the first component and the second component does not exceed a predetermined maximum allowed active power ripple.

When the first component is reactive current, the system can be said to be in reactive current priority mode. On the other hand, when first component is active current, the system can be said to be in reactive current priority mode. It should be noted that for active power/current priority, predetermination of the positive and negative sequence components of the reactive injection current is not required.

In one embodiment, the first component of the injection current is an active injection current. The second component of the injection current is a reactive injection current. The reference power of the power generation system is a maximum allowed active power ripple.

Determining the first component of the injection current may include determining a positive sequence component and a negative sequence component of the first component of the injection current such that the active power ripple caused by the injection current comprising the first component and the second component does not exceed the maximum allowed active power ripple and such that the power transfer to the power grid from the power generation system turbine is maximum. The values for the positive and negative sequence components of the first component of the injection current may be selecting from a plurality of possible solutions for the positive and negative sequence components of the first component of the injection current depending on at least one of information about the situation in the power grid and the performance of the power generation system.

Figure 26:
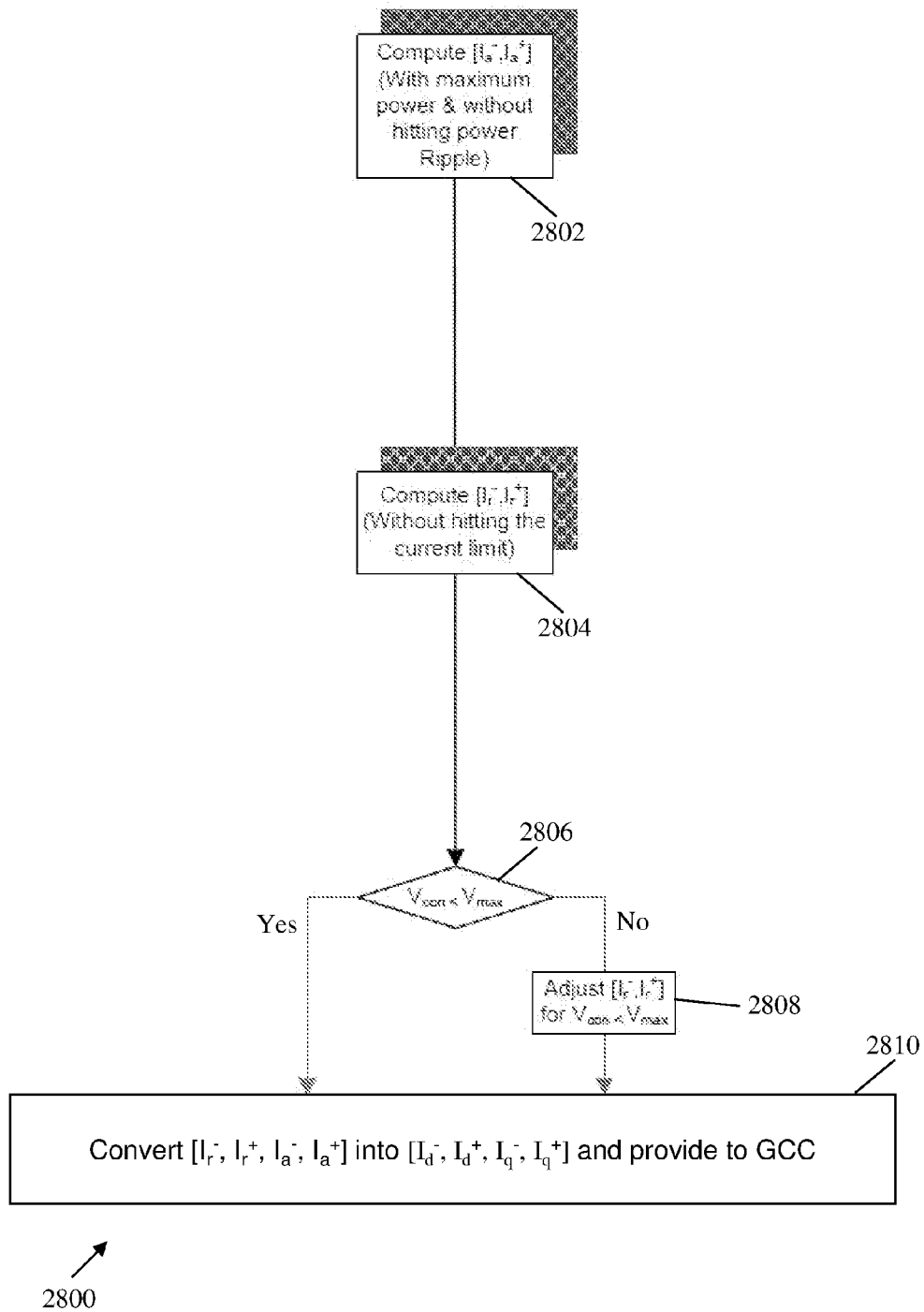
FIG. 26 shows a flowchart for determining an injection current under active power/current priority according to an embodiment.

FIG. 26 shows a flowchart for determining an injection current under active power/current priority. FIG. 26 illustrates the sequence 214 of the flowchart 200 shown in FIG. 2. At 2802, a positive sequence active injection current $I_a^+$ and a negative sequence active injection current $I_a^-$ are determined. The positive sequence active injection current $I_a^+$ and the negative sequence active injection current $I_a^-$ may be determined to ensure that active power transfer to the grid can be maximized without exceeding the active power ripples limits or creating trouble for the DC link voltage ripples. At 2804, a positive sequence reactive injection current $I_r^+$ and a negative sequence reactive injection current $I_r^-$ are determined. The positive sequence reactive injection current $I_r^+$ and the negative sequence reactive injection current $I_r^-$ may be determined to ensure that the converter current limits will not be exceeded and power ripples are within tolerances.

At 2806, it is determined whether a grid side converter voltage $V_{con}$ according to the injection current in accordance with the positive sequence active injection current $I_a^+$, the negative sequence active injection current $I_a^-$, the positive sequence reactive injection current $I_r^+$ and the negative sequence reactive injection current $I_r^-$ exceeds a predetermined converter voltage limit $V_{max}$. This can ensure that the power converter of the wind turbine operates in a linear mode of modulation.

If it is determined that the grid side converter voltage $V_{con}$ exceeds the predetermined converter voltage limit $V_{max}$, the positive sequence reactive injection current $I_r^+$ and the negative sequence reactive injection current $I_r^-$ are adjusted such that the grid side converter voltage $V_{con}$ does not exceed the converter voltage limit $V_{max}$ at 2808. At 2810, the positive sequence reactive injection current $I_r^+$, the negative sequence reactive injection current $I_r^-$, the positive sequence active injection current $I_a^+$ and the negative sequence active injection current $I_a^-$ are converted into current references in a rotating frame (i.e. $I_q^+$, $I_q^-$, $I_d^+$ and $I_d^-$), and the $I_q^+$, $I_q^-$, $I_d^+$ and $I_d^-$ are provided to a grid current controller/grid side converter current control. The way that the positive sequence reactive injection current $I_r^+$, the negative sequence reactive injection current $I_r^-$, the positive sequence active injection current $I_a^+$ and the negative sequence active injection current $I_a^-$ are converted into $I_q^+$, $I_q^-$, $I_d^+$ and $I_d^-$ respectively are described above with reference to FIG. 17.

Referring back to 2806, if it is determined that the grid side converter voltage $V_{con}$ does not exceed the converter voltage limit $V_{max}$, the flowchart proceeds directly from 2806 to 2810.

From the above description, it can be understood that when the first component of the injection current is a reactive current, the wind turbine system can be assumed to be in a reactive power/current priority mode. When the first component of the injection current is an active current, the wind turbine system can be assumed to be in an active power/current priority mode.

The above description describes an overall process for determining a current injected into a grid during an asymmetrical fault or a voltage unbalance condition for both reactive and active power/current priority. Unlike normal voltage condition and symmetrical fault condition in which the negative sequence reactive current reference ($I_r^-$) and the negative sequence active current reference ($I_a^-$) are zero, the negative sequence reactive current reference ($I_r^-$) and the negative sequence active current reference ($I_a^-$) may be nonzero (for better support) during asymmetrical grid faults and voltage unbalance condition. For example, in the event when the sum of the positive sequence reactive current $I_r^+$ and the negative sequence reactive current $I_r^-$ is smaller than a maximum current limit ($I_r^+ + I_r^- < I_m$) as described above with reference to FIG. 25 and for active power/current priority as described above with reference to FIG. 26, the negative sequence reactive current reference ($I_r^-$) and the negative sequence active current reference ($I_a^-$) may be calculated and fed to grid current control algorithm for better handling. Therefore, for the asymmetrical fault handling, all four current references, i.e. positive sequence reactive current reference ($I_r^+$), negative sequence reactive current reference ($I_r^-$), positive sequence active current reference ($I_a^+$) and negative sequence active current reference ($I_a^-$), may be provided to the grid side converter control.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of operating a power generation system coupled to a power grid during a grid unbalance event or a grid fault event, the method comprising:
    determining a power grid voltage;
    determining a negative sequence grid voltage of the power grid from the power grid voltage;
    determining, based on a comparison of the negative sequence grid voltage with a reference voltage, a negative sequence reactive injection current for selective injection into the power grid;
    determining, based on the power grid voltage, a positive sequence reactive injection current for selective injection into the power grid; and
    selecting, based on whether a sum of the determined positive sequence and negative sequence reactive injection currents exceeds a maximum current limit of a converter of the power generation system, one of first and second predetermined processing sequences to be performed using the positive sequence and negative sequence reactive injection currents as inputs, the first predetermined processing sequence being selected when the sum does not exceed the maximum current limit and the second predetermined processing sequence being selected when the sum exceeds the maximum current limit,
    wherein each of the first and second predetermined processing sequences operates to alter at least one of the determined positive sequence and negative sequence reactive injection currents.

2. The method according to claim 1, wherein the reference voltage specifies the negative sequence grid voltage towards which the determined negative sequence grid voltage should be reduced by supplying the negative sequence reactive injection current to the power grid.

3. The method according to claim 1, wherein the reference voltage reflects a tolerance limit on an amount of negative sequence grid voltage that the power generation system can handle.

4. The method according to claim 3, wherein the reference voltage is set to a small percentage of a nominal grid voltage.

5. The method according to claim 1, wherein the negative sequence reactive injection current is injected into the power grid when the determined negative sequence grid voltage exceeds the reference voltage.

6. The method according to claim 5, wherein the negative sequence reactive injection current has a linear relationship with the negative sequence grid voltage up to a predetermined maximum negative sequence injection current limit.

7. The method according to claim 6, wherein the maximum negative sequence reactive injection current limit is a current limit depending on a maximum current limit of a converter of the power generation system and a positive sequence reactive injection current value.

8. The method according to claim 6, wherein the linear relationship between the negative sequence reactive injection current and the negative sequence grid voltage is represented by a slope.

9. The method according to claim 8, wherein the slope is substantially inversely proportional to a total impedance of one or more of a group consisting of an impedance of a nacelle transformer, an impedance of a wind park transformer, and an impedance of the power grid.

10. The method according to claim 5, wherein the negative sequence reactive injection current and the negative sequence grid voltage have a non-linear relationship or a tabular relationship.

11. The method according to claim 1, wherein determining the positive sequence reactive injection current for selective injection into the power grid is based on at least one of a positive sequence grid voltage, a minimum line voltage, a maximum line voltage, a minimum phase voltage and a maximum phase voltage.

12. The method according to claim 11, wherein the positive sequence reactive injection current is determined based on the positive sequence grid voltage and the method further comprises determining the positive sequence grid voltage of the power grid from the power grid voltage.

13. The method according to claim 11, wherein the at least one of the positive sequence grid voltage, the minimum line voltage, the maximum line voltage, the minimum phase voltage, and the maximum phase voltage depends on at least one of the country in which the power generation system is operated, the region in which the power generation system is operated and a grid code applicable for the power generation system.

14. The method of claim 6, wherein a value of the slope is based on compliance with a grid code applicable for the power generation system.

15. The method of claim 1, further comprising:
selecting a voltage location within the power generation system,
wherein the power grid voltage and negative sequence grid voltage are determined relative to the selected voltage location, and
wherein the positive sequence and negative sequence reactive injection currents are determined to control the negative sequence grid voltage at the selected voltage location.

16. The method of claim 15, wherein the voltage location is selected from one of a point within the power grid, a point of common coupling between the power generation system and the power grid, and a point within a wind farm that includes the power generation system.

17. The method of claim 15, wherein the voltage location is selected at low-voltage terminals of the power generation system.

18. The method of claim 15, wherein the negative sequence reactive injection current is supplied to the power grid when the determined negative sequence grid voltage exceeds the reference voltage,
wherein the negative sequence reactive injection current has a linear relationship with the negative sequence grid voltage up to a predetermined maximum negative sequence injection current limit,
wherein the linear relationship between the negative sequence reactive injection current and the negative sequence grid voltage is represented by a slope, and
wherein a value of the slope is based on the selected voltage location within the power generation system.

19. The method of claim 4, wherein the small percentage is selected between about 2% and about 5% of the nominal grid voltage.

20. The method of claim 1, further comprising:
performing the selected processing sequence using the positive sequence and negative sequence reactive injection currents to produce processed positive sequence and negative sequence reactive injection currents;
transforming the processed positive sequence and negative sequence reactive injection currents into a rotating reference frame; and
providing the transformed, processed positive sequence and negative sequence reactive injection currents to a grid-side converter controller of the power generation system.

21. The method of claim 1, wherein the selected processing sequence includes determining an active power ripple value that would result from injecting the positive sequence and negative sequence reactive injection currents.

22. The method of claim 21, wherein the selected processing sequence includes altering at least one of the positive sequence and negative sequence reactive injection currents based on the determined active power ripple value.

23. The method of claim 20, further comprising:
determining, based on the selected processing sequence, positive sequence and negative sequence active injection currents;
transforming the positive sequence and negative sequence active injection currents into a rotating reference frame; and
providing the transformed positive sequence and negative sequence active injection currents to the grid-side converter controller.

24. The method of claim 23, further comprising:
determining whether application of the positive sequence and negative sequence reactive injection currents will cause a voltage of the grid-side converter controller to exceed a predetermined voltage limit; and
if so, adjusting at least one of the positive sequence and negative sequence reactive injection currents and the positive sequence and negative sequence active injection currents such that the voltage of the grid-side converter controller does not exceed the predetermined voltage limit.

25. A computer program product, comprising:
a non-transitory computer-readable medium including program instructions for operation of a power generation system coupled with a power grid during one of a grid unbalance event and a grid fault event, the operation comprising:

determining a power grid voltage;

determining a negative sequence grid voltage of the power grid from the power grid voltage;

determining, based on a comparison of the negative sequence grid voltage with a reference voltage, a negative sequence reactive injection current for selective injection into the power grid;

determining, based on the power grid voltage, a positive sequence reactive injection current for selective injection into the power grid; and selecting, based on whether a sum of the determined positive sequence and negative sequence reactive injection currents exceeds a maximum current limit of a converter of the power generation system, one of first and second predetermined processing sequences to be performed using the positive sequence and negative sequence reactive injection currents as inputs, the first predetermined processing sequence being selected when the sum does not exceed the maximum current limit and the second predetermined processing sequence being selected when the sum exceeds the maximum current limit, wherein each of the first and second predetermined processing sequences operates to alter at least one of the determined positive sequence and negative sequence reactive injection currents.

26. The computer program product of claim 25, wherein the reference voltage specifies the negative sequence grid voltage towards which the determined negative sequence grid voltage should be reduced by supplying the negative sequence reactive injection current to the power grid.

27. The computer program product of claim 25, wherein the reference voltage reflects a tolerance limit on an amount of negative sequence grid voltage that the power generation system can handle.

28. The computer program product of claim 27, wherein the reference voltage is set to a small percentage of a nominal grid voltage.

29. The computer program product of claim 25, wherein the negative sequence reactive injection current is injected into the power grid when the determined negative sequence grid voltage exceeds the reference voltage.

30. The computer program product of claim 29, wherein the negative sequence reactive injection current has a linear relationship with the negative sequence grid voltage up to a predetermined maximum negative sequence injection current limit.

31. The computer program product of claim 30, wherein the maximum negative sequence reactive injection current limit is a current limit depending on a maximum current limit of a converter of the power generation system and a positive sequence reactive injection current value.

32. The computer program product of claim 30, wherein the linear relationship between the negative sequence reactive injection current and the negative sequence grid voltage is represented by a slope.

33. The computer program product of claim 32, wherein the slope is substantially inversely proportional to a total impedance of one or more of a group consisting of an impedance of a nacelle transformer, an impedance of a wind park transformer, and an impedance of the power grid.

34. The computer program product of claim 29, wherein the negative sequence reactive injection current and the negative sequence grid voltage have a non-linear relationship or a tabular relationship.

35. The computer program product of claim 25, wherein determining the positive sequence reactive injection current for selective injection into the power grid is based on at least one of a positive sequence grid voltage, a minimum line voltage, a maximum line voltage, a minimum phase voltage and a maximum phase voltage.

36. The computer program product of claim 35, wherein the positive sequence reactive injection current is determined based on the positive sequence grid voltage and the method further comprises determining the positive sequence grid voltage of the power grid from the power grid voltage.

37. The computer program product of claim 35, wherein the at least one of the positive sequence grid voltage, the minimum line voltage, the maximum line voltage, the minimum phase voltage, and the maximum phase voltage depends on at least one of the country in which the power generation system is operated, the region in which the power generation system is operated and a grid code applicable for the power generation system.

38. The computer program product of claim 30, wherein a value of the slope is based on compliance with a grid code applicable for the power generation system.

39. The computer program product of claim 25, the operation further comprising:

selecting a voltage location within the power generation system, wherein the power grid voltage and negative sequence grid voltage are determined relative to the selected voltage location, and wherein the positive sequence and negative sequence reactive injection currents are determined to control the negative sequence grid voltage at the selected voltage location.

40. The computer program product of claim 39, wherein the voltage location is selected from one of a point within the power grid, a point of common coupling between the power generation system and the power grid, and a point within a wind farm that includes the power generation system.

41. The computer program product of claim 39, wherein the voltage location is selected at low-voltage terminals of the power generation system.

42. The computer program product of claim 39, wherein the negative sequence reactive injection current is supplied to the power grid when the determined negative sequence grid voltage exceeds the reference voltage, wherein the negative sequence reactive injection current has a linear relationship with the negative sequence grid voltage up to a predetermined maximum negative sequence injection current limit, wherein the linear relationship between the negative sequence reactive injection current and the negative sequence grid voltage is represented by a slope, and wherein a value of the slope is based on the selected voltage location within the power generation system.

43. The computer program product of claim 28, wherein the small percentage is selected between about 2% and about 5% of the nominal grid voltage.

44. The computer program product of claim 25, the operation further comprising:

performing the selected processing sequence using the positive sequence and negative sequence reactive injection currents to produce processed positive sequence and negative sequence reactive injection currents;

transforming the processed positive sequence and negative sequence reactive injection currents into a rotating reference frame; and providing the transformed, processed positive sequence and negative sequence reactive injection currents to a grid-side converter controller of the power generation system.

45. The computer program product of claim 25, wherein the selected processing sequence includes determining an active power ripple value that would result from injecting the positive sequence and negative sequence reactive injection currents.

46. The computer program product of claim 45, wherein the selected processing sequence includes altering at least one of the positive sequence and negative sequence reactive injection currents based on the determined active power ripple value.

* * * * *